United States Patent
Chu et al.

(10) Patent No.: US 9,567,206 B2
(45) Date of Patent: Feb. 14, 2017

(54) STRUCTURES AND FORMATION METHODS OF MICRO-ELECTRO MECHANICAL SYSTEM DEVICE

(71) Applicant: Taiwan Semiconductor Manufacturing Co., Ltd., Hsin-Chu (TW)

(72) Inventors: Chia-Hua Chu, Zhubei (TW); Chun-Wen Cheng, Zhubei (TW); Shang-Ying Tsai, Pingzhen (TW); Chin-Wei Liang, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 10 days.

(21) Appl. No.: 14/276,295

(22) Filed: May 13, 2014

(65) Prior Publication Data
US 2015/0284240 A1  Oct. 8, 2015

Related U.S. Application Data

(63) Continuation-in-part of application No. 14/084,161, filed on Nov. 19, 2013.

(51) Int. Cl.
*B81B 7/02* (2006.01)
*B81B 7/00* (2006.01)
*B81C 1/00* (2006.01)

(52) U.S. Cl.
CPC ............. *B81B 7/0041* (2013.01); *B81B 7/02* (2013.01); *B81C 1/00238* (2013.01); *B81C 1/00293* (2013.01)

(58) Field of Classification Search
CPC ........ H01L 21/50; H01L 23/498; H01L 29/84; B81B 7/00; B81B 7/0041; B81B 7/02; B81C 1/00238; B81C 1/00269; B81C 1/00293
See application file for complete search history.

(56) References Cited

U.S. PATENT DOCUMENTS

| | | | |
|---|---|---|---|
| 7,659,150 B1 | 2/2010 | Monadgemi et al. | |
| 8,350,346 B1 | 1/2013 | Huang et al. | |
| 2008/0284682 A1* | 11/2008 | Oh | H01J 11/12 345/60 |
| 2009/0134459 A1 | 5/2009 | Goto et al. | |
| 2009/0294879 A1 | 12/2009 | Bhagavat et al. | |
| 2012/0142144 A1* | 6/2012 | Taheri | B81B 7/007 438/107 |
| 2012/0326248 A1 | 12/2012 | Daneman et al. | |
| 2013/0193527 A1* | 8/2013 | Chu | H01L 21/76898 257/414 |

(Continued)

*Primary Examiner* — Fazli Erdem
(74) *Attorney, Agent, or Firm* — Birch, Stewart, Kolasch & Birch, LLP

(57) ABSTRACT

A micro-electro mechanical system (MEMS) device is provided. The MEMS device includes a cap substrate and a MEMS substrate bonded with the cap substrate. The MEMS substrate includes a first movable element and a second movable element. The MEMS device also includes a first closed chamber between the MEMS substrate and the cap substrate, and the first movable element is in the first closed chamber. The MEMS device further includes an outgassing layer in the first closed chamber. In addition, the MEMS device includes a second closed chamber between the MEMS substrate and the cap substrate, and the second movable element is in the second closed chamber.

20 Claims, 31 Drawing Sheets

(56) References Cited

U.S. PATENT DOCUMENTS

| | | |
|---|---|---|
| 2013/0283912 A1 | 10/2013 | Lin |
| 2013/0334621 A1* | 12/2013 | Classen ................. B81B 3/0018 257/415 |
| 2014/0015069 A1 | 1/2014 | Liang et al. |
| 2014/0151820 A1 | 6/2014 | Howe et al. |
| 2014/0225206 A1* | 8/2014 | Lin ....................... B81B 7/0038 257/417 |
| 2014/0227816 A1 | 8/2014 | Zhang et al. |
| 2015/0061046 A1 | 3/2015 | Chang et al. |
| 2015/0091153 A1 | 4/2015 | Liu et al. |
| 2015/0097215 A1* | 4/2015 | Chu .................... B81C 1/00238 257/254 |
| 2015/0097253 A1* | 4/2015 | Tsau ..................... B81B 7/0038 257/415 |
| 2015/0329351 A1 | 11/2015 | Cheng et al. |

* cited by examiner

STRUCTURES AND FORMATION METHODS OF MICRO-ELECTRO MECHANICAL SYSTEM DEVICE

PRIORITY CLAIM AND CROSS-REFERENCE

This application is a Continuation-In-Part of pending U.S. patent application Ser. No. 14/084,161, filed Nov. 19, 2013 and entitled "MECHANISMS FOR FORMING MICRO-ELECTRO MECHANICAL SYSTEM DEVICE", the entire of which is incorporated by reference herein.

BACKGROUND

The semiconductor integrated circuit (IC) has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component that can be created using a fabrication process) has decreased. Such advances have increased the complexity of processing and manufacturing ICs. For these advances, similar developments in IC processing and manufacturing are needed.

Micro-electro mechanical system (MEMS) devices have recently been developed. MEMS devices include devices fabricated using semiconductor technology to form mechanical and electrical features. The MEMS devices may include a number of elements (e.g., movable elements) for achieving mechanical functionality.

MEMS applications include motion sensors, pressure sensors, printer nozzles, or the like. Other MEMS applications include inertial sensors, such as accelerometers for measuring linear acceleration and gyroscopes for measuring angular velocity. Moreover, MEMS applications may extend to optical applications, such as movable mirrors, and radio frequency (RF) applications, such as RF switches or the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
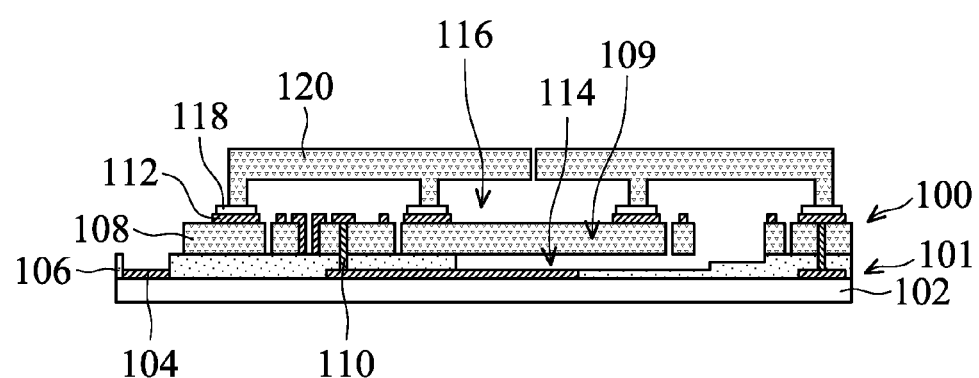
FIG. 1 is a cross-sectional view of a MEMS device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure will be described with respect to embodiments in a specific context, a micro-electro-mechanical system (MEMS) device. The embodiments of the disclosure may also be applied, however, to a variety of electrical or mechanical semiconductor devices. Hereinafter, various embodiments will be explained with reference to the accompanying drawings. Some variations of the embodiments are described.

FIG. 1 is a cross-sectional view of a MEMS device 10, in accordance with some embodiments. The MEMS device 10 includes a MEMS substrate 100, a CMOS substrate 101, and a cap substrate 120. As shown in FIG. 1, the MEMS substrate 100 is sandwiched between the CMOS substrate 101 and the cap substrate 120.

Suitable bonding techniques may be used to bond the MEMS substrate 100, the CMOS substrate 101, and the cap substrate 120 together. The suitable bonding techniques may include fusion bonding, eutectic bonding, plasma activated bonding, thermocompression bonding, diffusion bonding, anodic bonding, other applicable bonding, or combinations thereof. Multiple cavities, including cavities 116 and 114, are formed. The cavity 116 is formed between the MEMS substrate 100 and the cap substrate 120, and the cavity 114 is formed between the MEMS substrate 100 and the CMOS substrate 101.

The CMOS substrate 101 includes a semiconductor substrate 102. The semiconductor substrate 102 may be made of silicon. Alternatively, the semiconductor substrate 102 may be made of other semiconductor materials, such as silicon germanium (SiGe), silicon carbide, other suitable semiconductor materials, or combinations thereof. Other substrates may also be used. For example, the semiconductor substrate 102 may include a multi-layered substrate, gradient substrate, hybrid orientation substrate, or combinations thereof. A wide variety of device elements, such as CMOS transistors, may be formed in/on the semiconductor substrate 102.

An interconnect structure is formed over the semiconductor substrate 102, as shown in FIG. 1. The interconnect structure includes a dielectric layer 106, which include multiple dielectric layers, and metal layers, which includes conductive pads 104. The conductive pads 104 may be electrically connected to the device elements formed in/on the semiconductor substrate 102, respectively. The conductive pad 104 may be used to provide electrical connections between the device elements and elements of the MEMS substrate 100.

As shown in FIG. 1, the MEMS substrate 100 is bonded with the CMOS substrate 101 and the cap substrate 120. The MEMS substrate 100 includes a semiconductor layer 108. The semiconductor layer 108 may be made of silicon or other applicable materials. The semiconductor layer 108 is patterned to have a variety of elements including a sensing element 109. The sensing element 109 is a movable element which is capable of bending, vibrating, deforming, or the like.

A conductive layer 112 may be formed over semiconductor layer 108. A conductive plug 110 may be formed between the conductive layer 112 and the conductive pad 104. Therefore, electrical connections between the elements of the MEMS substrate 100 and the device elements of the CMOS substrate 101 are established. The conductive layer 112 may also be used to bond with the cap substrate 120 through a bonding layer 118. The bonding layer 118 may be made of a semiconductor material, metal material, dielectric material, polymer material, other applicable materials, or combinations thereof.

In some embodiments, the sensing element 109 is a pliable diaphragm. The diaphragm is configured to measure a pressure within an adjacent cavity, such as the cavity 116, based upon capacitance changes caused by a force that the pressure exerts on the diaphragm. For example, a high pressure existent within the cavity 116 could cause the diaphragm to bend towards the cavity 114 more than a low pressure. As shown in FIG. 1, the cavity 114 may be a closed chamber with a high vacuum. Therefore, the diaphragm could bend towards the cavity 114 more easily. The sensitivity of the pressure sensor depends on the degree of vacuum of the cavity 114.

As shown in FIG. 1, the pressure or the degree of vacuum of the cavity 114 is determined when the cap substrate 120 is bonded with the MEMS substrate 100, in accordance with some embodiments. The pressure of the cavity 114 is substantially the same as the pressure of a process chamber used for bonding the cap substrate 120 and the MEMS substrate 100 together. Therefore, the cavities formed have one kind of pressure which is substantially the same as that of the process chamber. However, in some other embodiments, there is a need to form two or more cavities (or closed chambers) having different pressures.

Figure 2A:
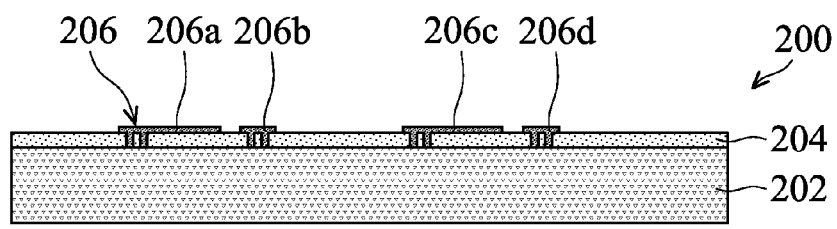
FIGS. 2A-2Q are cross-sectional views of various stages of a process for forming a MEMS device, in accordance with some embodiments.

As mentioned above, it is desirable to maintain the degree of vacuum of the cavity 114. In some embodiments, two or more cavities (or closed chambers) having different pressures are desirable. FIGS. 2A-2Q are cross-sectional views of various stages of a process for forming a MEMS device, in accordance with some embodiments.

As shown in FIG. 2A, a MEMS substrate 200 (or a MEMS wafer) is provided, in accordance with some embodiments. The MEMS substrate 200 includes a semiconductor substrate 202. The semiconductor substrate 202 includes a bulk semiconductor substrate such as a silicon wafer. The bulk semiconductor substrate may be made of silicon, germanium, silicon carbide, or the like. Alternatively, other substrates that may be used include multi-layered substrates, gradient substrates, hybrid orientation substrates, and/or the like. In some other embodiments, the semiconductor substrate 202 includes a semiconductor on insulator (SOI) substrate.

As shown in FIG. 2A, a dielectric layer 204, such as a silicon oxide layer or other suitable materials, is deposited over the semiconductor substrate 202. The dielectric layer 204 may be deposited by using a chemical vapor deposition (CVD) process, spin-on process, or other applicable processes. Afterwards, the dielectric layer 204 is patterned to form one or more contact holes in the dielectric layer 204. The contact holes expose the semiconductor substrate 202 underlying the dielectric layer 204.

As shown in FIG. 2A, a conductive layer 206 is deposited and patterned over the dielectric layer 204, in accordance with some embodiments. The conductive layer 206 is made of a conductive material having a high melting point, such as higher than about 900 degrees C. In some embodiments, the conductive layer 206 has a melting point higher than about 1200 degrees C. In some embodiments, the conductive layer 206 is made of a semiconductor material, such as polysilicon. The conductive layer 206 may be deposited by using a CVD process, physical vapor deposition (PVD) process, or other applicable processes. The conductive layer 206 may be doped with n-type impurities or p-type impurities to have a suitable conductivity.

The conductive layer 206 is patterned into multiple portions including portions 206a, 206b, 206c, and 206d, in accordance with some embodiments. Each of these portions may function as a contact element and/or an electrode element. Some of these portions may be electrically connected with each other.

Figure 2B:
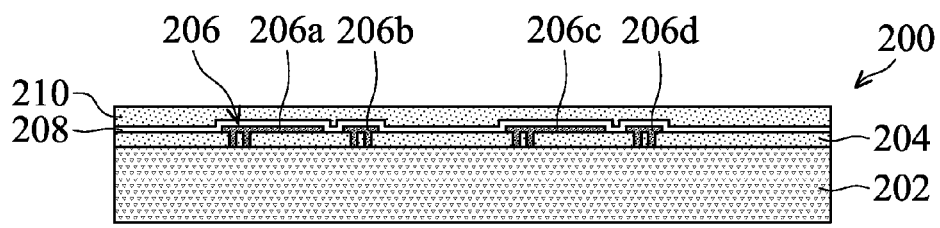

As shown in FIG. 2B, an etch stop layer 208 is deposited over the dielectric layer 204 and the conductive layer 206, in accordance with some embodiments. The etch stop layer 208 may be conformally deposited over the dielectric layer 204 and the conductive layer 206. The etch stop layer 208 may be made of silicon nitride, aluminum oxide, silicon carbide, other applicable materials, or combinations thereof. In some embodiments, the etch stop layer 208 is a low stress silicon nitride layer, which can also function as a blocking layer to prevent gas from penetrating through the etch stop layer 208. The etch stop layer 208 may be deposited by using a CVD process (such as a LPCVD process), spin-on process, or other applicable processes. The stress of the low stress silicon nitride layer may be in a range from about −50 MPa to about 50 MPa.

Afterwards, a dielectric layer 210 is deposited over the etch stop layer 208, as shown in FIG. 2B. The dielectric layer 210 may be made of silicon oxide or other suitable materials. A CVD process or the like may be performed to deposit the dielectric layer 210. A planarization process, such as a chemical mechanical polishing (CMP) process, may be performed on the dielectric layer 210.

Figure 2C:
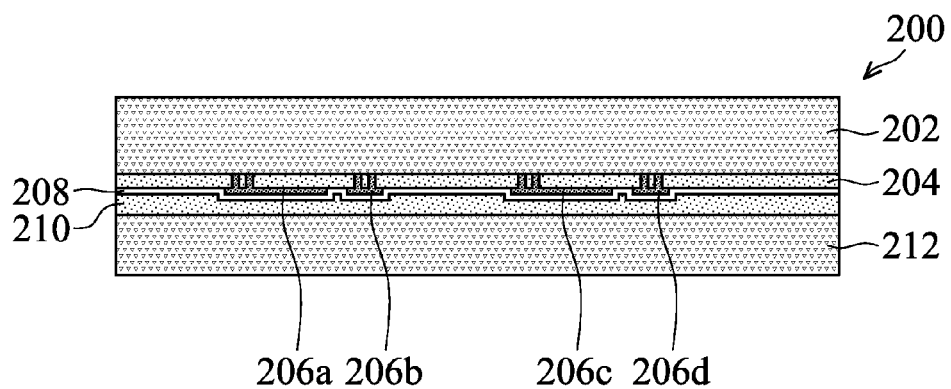

As shown in FIG. 2C, the MEMS substrate 200 is flipped upside down and bonded with a carrier substrate 212 (or a carrier wafer), in accordance with some embodiments. In subsequent operations, the carrier substrate 212 is thinned to be a blocking layer which is configured to block gas from penetrating through. Therefore, the carrier substrate 212 is made of a material capable of blocking gas. For example, the carrier substrate 212 may be made of a semiconductor material, metal material, dielectric material, other applicable materials, or combinations thereof. In some embodiments, the carrier substrate 212 is a semiconductor carrier wafer, such as a silicon wafer.

The MEMS substrate 200 may be bonded with the carrier substrate 212 through the dielectric layer 210. The carrier substrate 212 is in direct contact with the dielectric layer 210. The bonding between the carrier substrate 212 and the dielectric layer 210 may be achieved by using fusion bonding, eutectic bonding, plasma activated bonding, thermocompression bonding, diffusion bonding, anodic bonding, other applicable bonding, or combinations thereof. In some embodiments, the MEMS substrate 200 is disposed over the carrier substrate 212 such that the carrier substrate 212 and the dielectric layer 210 are bonded together. Afterwards, an annealing process may be performed to enhance the bonding between the carrier substrate 212 and the dielectric layer 210. For example, the bonded carrier substrate 212 and the dielectric layer 210 are annealed at a temperature of about 300 degrees C. Other temperatures and/or pressures may also be applied during the bonding process.

Figure 2D:
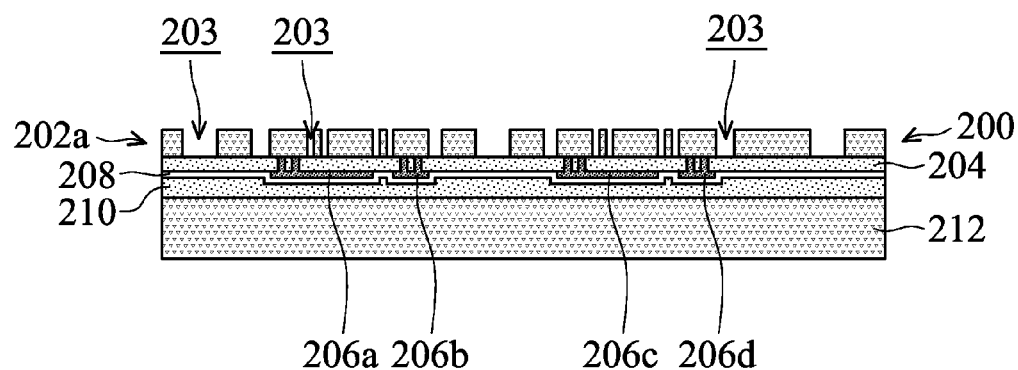

As shown in FIG. 2D, the semiconductor substrate 202 is thinned and patterned into a number of elements 202a, in accordance with some embodiments. The semiconductor substrate 202 may be thinned by using a mechanical grinding process, CMP process, etching process, other applicable processes, or combinations thereof. Afterwards, a portion of the thinned semiconductor substrate 202 is removed to form openings 203 which expose the dielectric layer 204. As a result, the thinned semiconductor substrate 202 is patterned to be the elements 202a. Some of the elements 202a connect with each other, and some of the elements do not connect with each other.

Figure 2E:
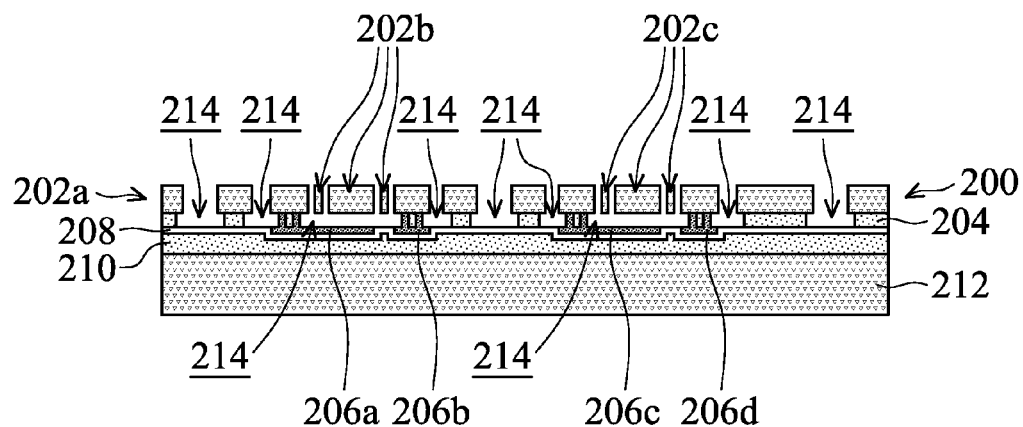

As shown in FIG. 2E, a portion of the dielectric layer 204 is removed through the openings 203 to form a number of cavities 214, in accordance with some embodiments. An etching process is performed to partially remove the dielectric layer 204. For example, a vapor HF is used as the etchant to remove the dielectric layer 204. Therefore, the cavities 214 are formed. The etch stop layer 208 prevents the dielectric layer 210 under the cavities 214 from being etched. After the cavities 214 are formed, a portion of the semiconductor substrate 202 is released from the dielectric layer 204 to form a number of elements 202a. Some or all of the elements 202a become movable elements which include movable elements 202b and 202c. The movable elements 202b and 202c are capable of bending, vibrating, deforming, or the like.

In some embodiments, the MEMS substrate 200 is annealed at a high temperature to induce the outgassing of the dielectric layers including the dielectric layers 204 and 210. Therefore, the dielectric layers contain less gas after being annealed. The degree of vacuum of a cavity or a closed chamber to be formed could be maintained more easily. For example, the MEMS substrate 200 is annealed at a temperature ranging from about 900 degrees C. to about 1200 degrees C. for about 2 hours. Different annealing times may also be used.

In some embodiments, the MEMS substrate 200 is annealed after the cavities 214 are formed. In some embodiments, the MEMS substrate 200 is annealed before the cavities 214 are formed. Since there is no metal line formed in the MEMS substrate 200, the annealing process could reduce the gas, coming from the dielectric layers 204 and 210, without destroying elements which have been formed in the MEMS substrate 200.

Figure 2F:
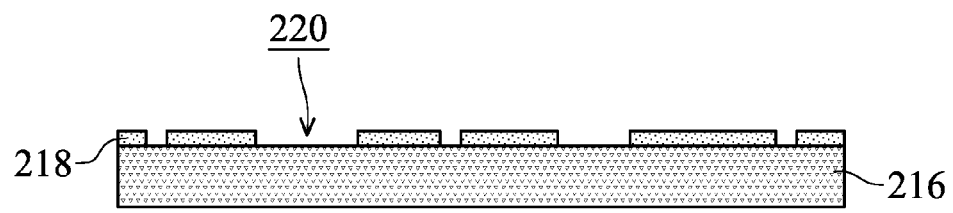

As shown in FIG. 2F, a cap substrate 216 (or cap wafer) and a patterned dielectric layer 218 formed over the cap substrate 216 are provided, in accordance with some embodiments. The cap substrate 216 may be made of a semiconductor material, such as silicon or the like. The dielectric layer 218 may be made of silicon oxide or other suitable materials. The dielectric layer 218 is patterned to have a number of openings 220 which expose the cap substrate 216.

In some embodiments, the cap substrate 216 and the dielectric layer 218 are annealed at a high temperature to induce the outgassing of the dielectric layer 218. Therefore, the dielectric layer 218 contains less gas after being annealed. The degree of vacuum of a cavity or a closed chamber to be formed could be maintained more easily. For example, the cap substrate 216 and the dielectric layer 218 are annealed at a temperature ranging from about 900 degrees C. to about 1200 degrees C. for about 2 hours. Different annealing times may also be used. In some embodiments, the dielectric layer 218 is made of a thermal oxide or the like. In these cases, the annealing process may not be needed.

Figure 2G:
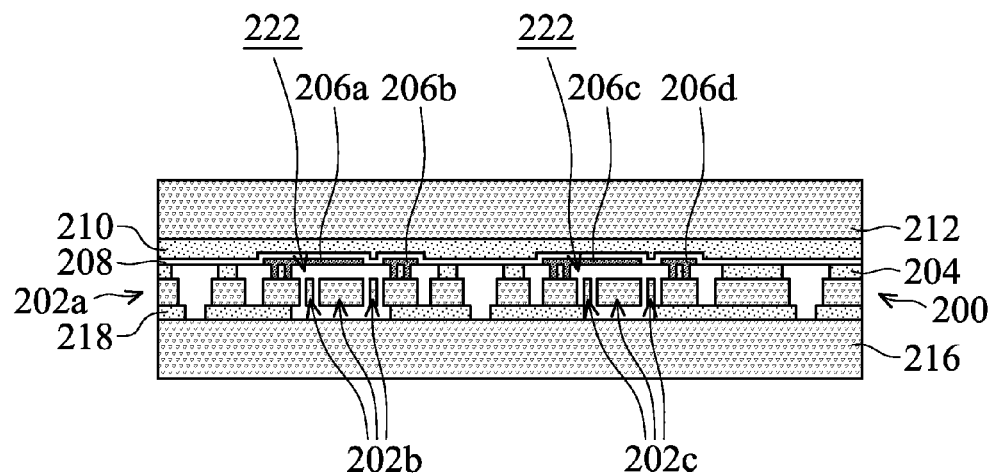

As shown in FIG. 2G, the structure shown in FIG. 2E is flipped upside down and bonded with the structure shown in FIG. 2F, in accordance with some embodiments. The elements 202a are bonded with the dielectric layer 218. The elements 202a may be in direct contact with the dielectric layer 218. The bonding between the elements 202a and the dielectric layer 218 may be achieved by using fusion bonding, eutectic bonding, plasma activated bonding, thermocompression bonding, diffusion bonding, anodic bonding, other applicable bonding, or combinations thereof.

As shown in FIG. 2G, a number of closed chambers 222 are formed between the cap substrate 216 and the carrier substrate 212 after the bonding between the elements 202a and the dielectric layer 218. Each of the closed chambers 222 is a combination of one of the cavities 214 and one of the openings 220. The elements 202a are surrounded by the closed chambers 222. Some of the closed chambers 222 are connected to each other. Some of the closed chambers 222 are isolated from each other. The bonding process may be performed in a process chamber, which has a predetermined pressure, of a bonding tool. As a result, the closed chambers 222 formed in the process chamber would also have substantially the same pressure. In some embodiments, the pressure of each of the closed chambers 222 is in a range from about 0.05 atm to about 3 atm. The pressure of the closed chambers 222 may be adjusted by tuning the pressure of the process chamber.

Figure 2H:
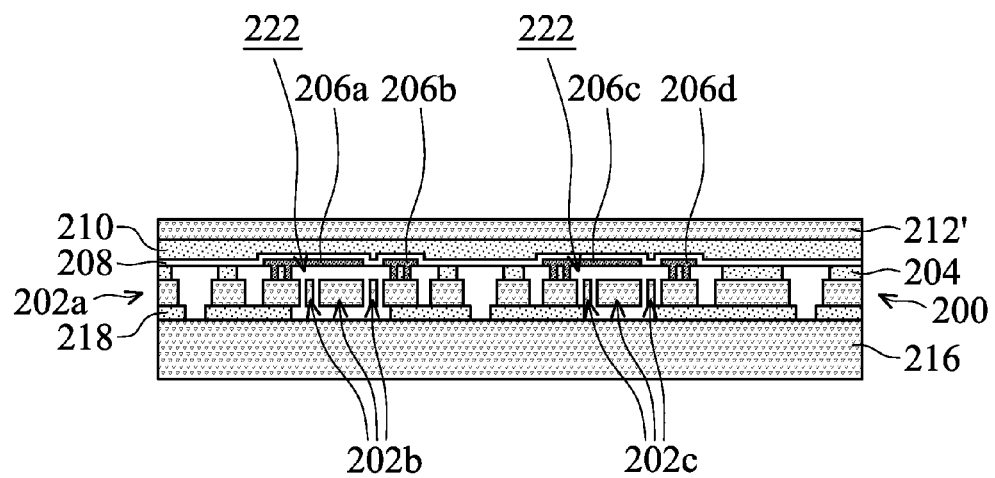

As shown in FIG. 2H, the carrier substrate 212 is thinned to be a blocking layer 212', in accordance with some embodiments. The blocking layer 212' is configured to block gas from penetrating through the blocking layer 212' to change the pressure of the closed chambers 222. The blocking layer 212' may have a thickness in a range from about 2 μm to about 10 μm. In some other embodiments, the carrier substrate 212 is not thinned. In these cases, the carrier substrate 212 can also function as a blocking layer.

Figure 2I:
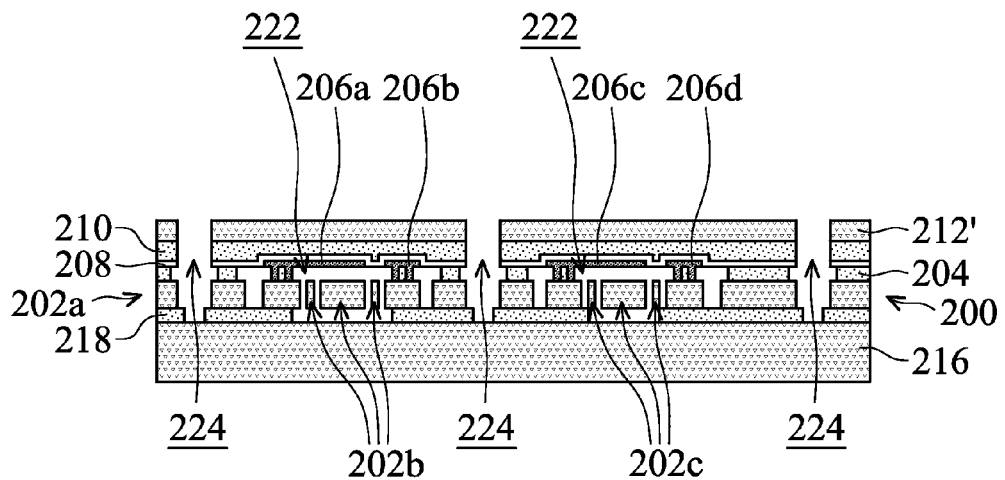

As shown in FIG. 2I, portions of the blocking layer 212', the dielectric layer 210, and the etch stop layer 208 are removed to form openings 224, in accordance with some embodiments. The openings 224 open some of the closed chambers 222 and expose the cap substrate 216. In some embodiments, a photolithography process and multiple etching processes are performed to form the openings 224. For example, a first etching process is performed to partially remove the blocking layer 212' to form through holes until the dielectric layer 210 is exposed. Afterwards, a second etching process is performed to partially remove the dielectric layer 210 and the etch stop layer 208. Both the dielectric layer 210 and the etch stop layer 208 may be etched in a single etching operation. For example, a suitable etchant, such as a mixture of CF4 and O2, may be used. As a result, the openings 224 are formed. Different etchants may be used in the first and second etching processes. An annealing process may then be performed at a temperature ranging from about 900 degrees C. to about 1200 degrees C. for about 2 hours. Different annealing times may also be used.

Figure 2J:
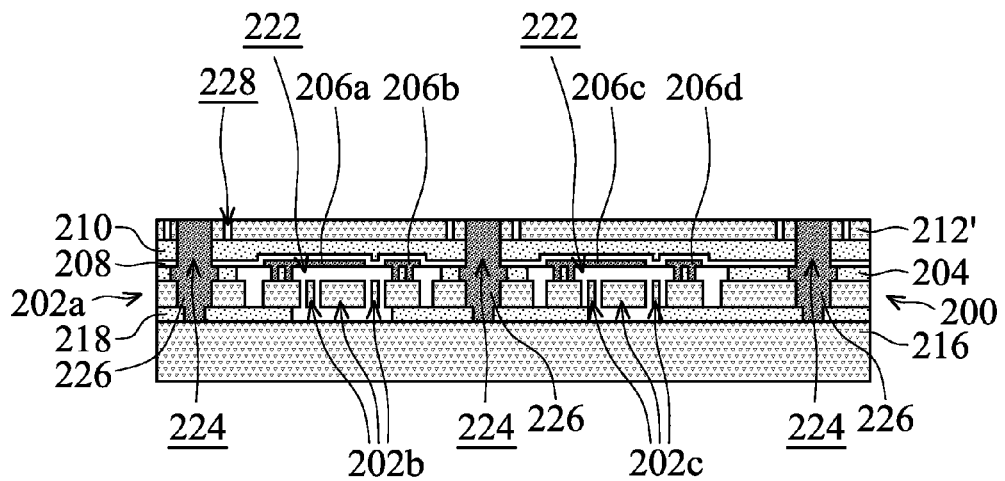

As shown in FIG. 2J, a second blocking layer 226 is deposited over the blocking layer 212' to fill the openings 224, in accordance with some embodiments. The second blocking layer 226 may be used to stop the gas coming from dielectric layers, such as those of a CMOS substrate (not shown in FIG. 2J) to be bonded with the MEMS substrate 200. The second blocking layer 226 may be made of a semiconductor material, metal material, or other applicable materials. For example, the second blocking layer 226 is made of polysilicon. The second blocking layer 226 may be deposited by using a CVD process (such as a LPCVD process), spin-on process, or other appropriate processes. A planarization process, such as a CMP process or the like, may be performed to remove the second blocking layer 226 outside of the openings 224.

If the blocking layer 212' and the second blocking layer 226 are electrically conductive, the blocking layer 212' may be patterned to form recesses 228 to separate the blocking layer 212' and the second blocking layer 226 into multiple isolated portions. Therefore, short circuiting is prevented. In some embodiments, each of the blocking layer 212' and the second blocking layer 226 also functions as an electrical shielding. Electromagnetic interference caused by neighboring elements, such as those of a CMOS substrate (not shown in FIG. 2J) to be bonded with the MEMS substrate 200, may be prevented by the blocking layer 212' and the second blocking layer 226.

In some embodiments, the materials of the second blocking layer 226 and the conductive layer 206 are substantially the same. For example, both the second blocking layer 226 and the conductive layer 206 are made of polysilicon. In some other embodiments, both the second blocking layer 226 and the conductive layer 206 are polysilicon layers with different doping concentrations. For example, the conductive layer 206 is a polysilicon layer with a higher doping concentration than the second blocking layer 226.

Figure 2K:
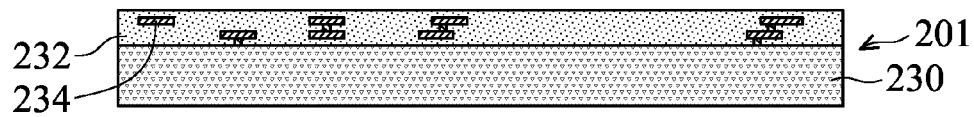

As shown in FIG. 2K, a CMOS substrate 201 (or a CMOS wafer) is provided, in accordance with some embodiments. The CMOS substrate 201 includes a semiconductor substrate 230 and a dielectric layer 232. The dielectric layer 232 includes multiple dielectric layers. Multiple conductive features (such as lines, vias, and contacts) are formed in the dielectric layer 232. The conductive features include conductive pads 234. Each of the conductive pads 234 is electrically connected to a region or a device element formed in/on the semiconductor substrate 230. In some embodiments, the dielectric layer 232 has a planarized top surface, which is, for example, a planarized oxide surface. The conductive pads 234 (or the top metal) may be buried under the planarized top surface.

Figure 2L:
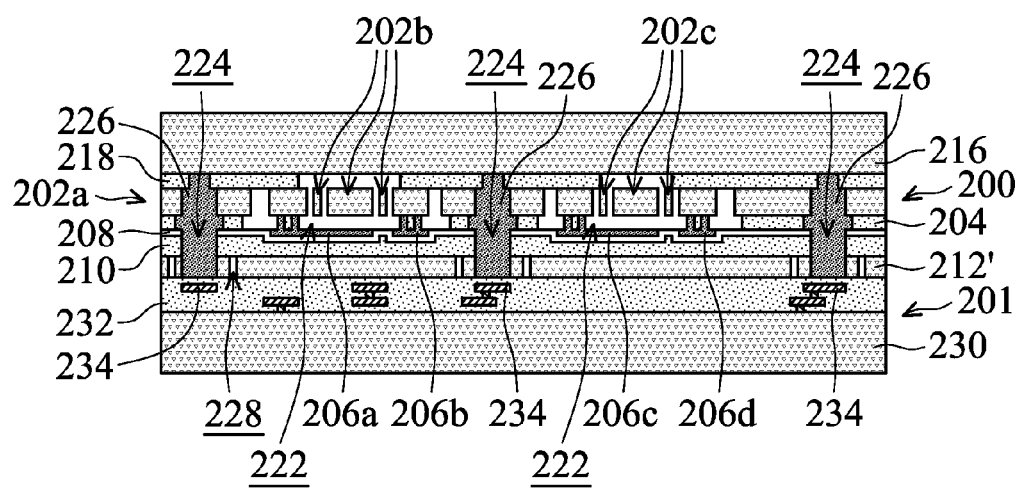

As shown in FIG. 2L, the MEMS substrate 200 and the CMOS substrate 201 are aligned and bonded with each other, in accordance with some embodiments. A fusion bonding process or other applicable processes may be performed to bond the planarized top surface of the dielectric layer 232 with the blocking layer 212' and the second blocking layer 226. In some embodiments, both the blocking layer 212' and the second blocking layer 226 are in direct contact with the dielectric layer 232. Some of the conductive pads 234 are substantially aligned with the second blocking layer 226 filling the openings 224.

Figure 2M:
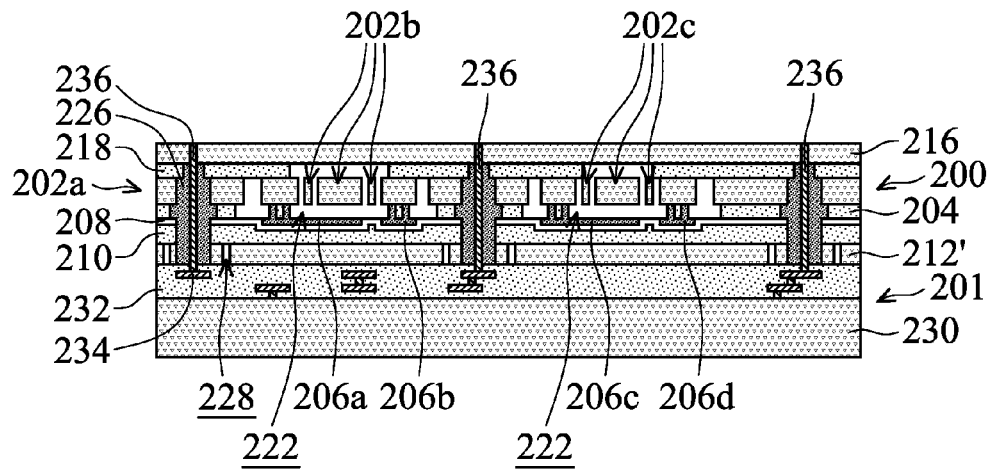

Afterwards, as shown in FIG. 2M, the cap substrate 216 is thinned, in accordance with some embodiments. The cap substrate 216 is thinned using a suitable process. The suitable process may include a mechanical grinding process, CMP process, etching process, other applicable processes, or combinations thereof.

As shown in FIG. 2M, conductive plugs 236 are formed to electrically and respectively connect to the conductive pads 234, in accordance with some embodiments. Each of the conductive plugs 236 penetrates through the cap substrate 216, the second blocking layer 226, and the dielectric layer 232 to electrically contact with the corresponding one of the conductive pads 234. In some embodiments, the conductive plugs 236 are in direct contact with the second blocking layer 226. Each of the conductive plugs 236 may have a single width.

In some embodiments, a photolithography process and multiple etching processes are performed to form a number of via openings. Each of the via openings exposes a corresponding one of the conductive pads 234. For example, a first etching process is performed to partially remove the cap substrate 216 and the second blocking layer 226 to form a through hole until the dielectric layer 232 is exposed. Afterwards, a second etching process is performed to partially remove the dielectric layer 232 such that the conductive pads 234 are exposed. As a result, the via openings are formed. Different etchants may be used in the first and second etching processes.

After the forming of the via openings, a conductive material may be deposited to fill the via openings to form the conductive plugs 236. In some embodiments, a planarization process, such as a CMP process, is performed to remove the conductive material outside of the via openings. The conductive material may be made of tungsten, copper, titanium, nickel, gold, other suitable materials, or combinations thereof. The conductive material may be deposited by using a CVD process, plating process, PVD process, other applicable processes, or combinations thereof.

Figure 2N:
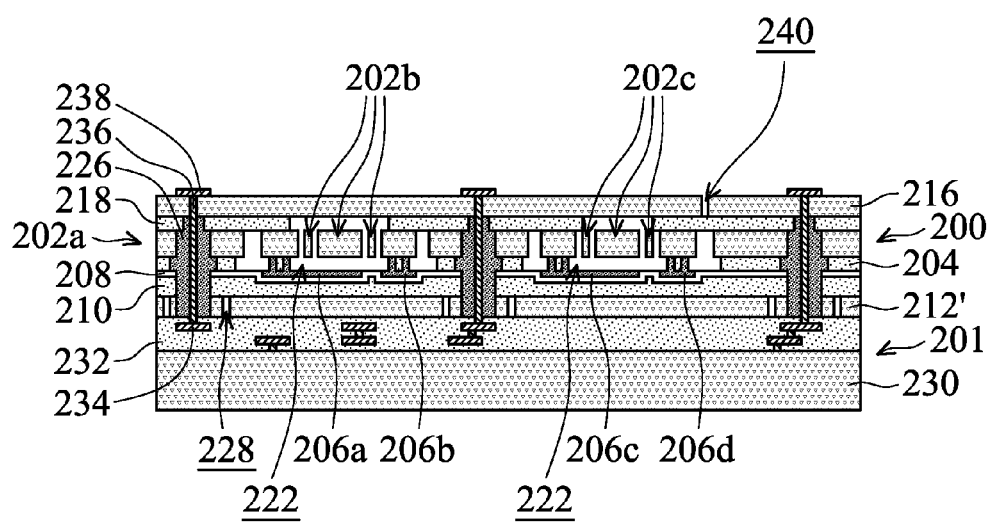

As shown in FIG. 2N, conductive pads 238 are formed over the cap substrate 216 to electrically contact with the conductive plugs 236, in accordance with some embodiments. The conductive pads 238 may be made of copper, aluminum, gold, other applicable materials, or combinations thereof. A metal layer may be deposited and patterned over the cap substrate 216 to form the conductive pads 238.

As shown in FIG. 2N, one or more release holes 240 are formed in the cap substrate 216 to expose the dielectric layer 218, in accordance with some embodiments. A photolithography process and an etching process may be performed to form the release hole(s) 240. In some embodiments, a single release hole 240 is formed in the cap substrate 216.

Figure 2O:
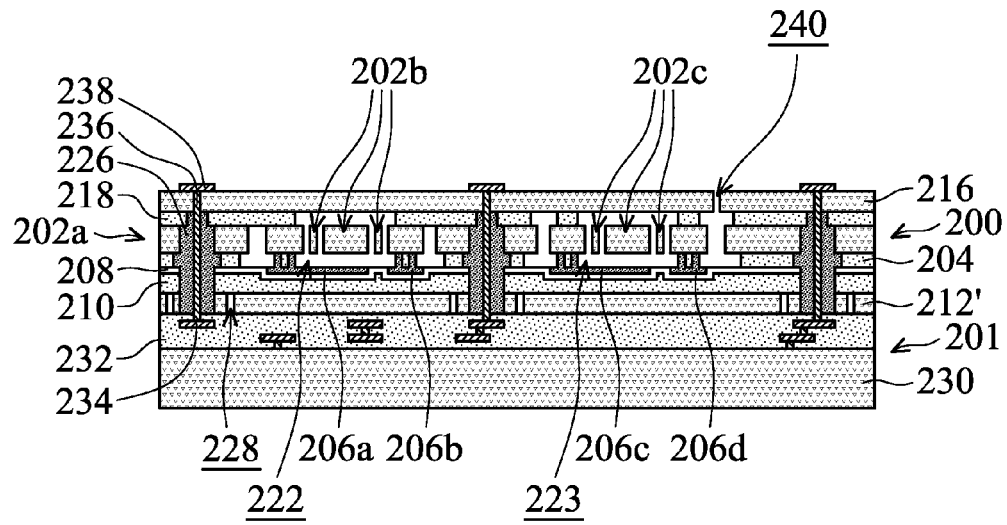

As shown in FIG. 2O, a portion of the dielectric layer 218 is removed through the release hole(s) 240 such that the closed chamber 222 is open to be a cavity 223, in accordance with some embodiments. An etching process is performed to form the cavity 223 surrounding the movable elements 202c. A portion of the dielectric layer 218 originally surrounding the closed chamber 222 is now removed such that the movable elements 202c are surrounded by the cavity 223. The movable elements 202c are free to move, compared with the movable elements 202c at the stage shown in FIG. 2N.

Figure 2P:
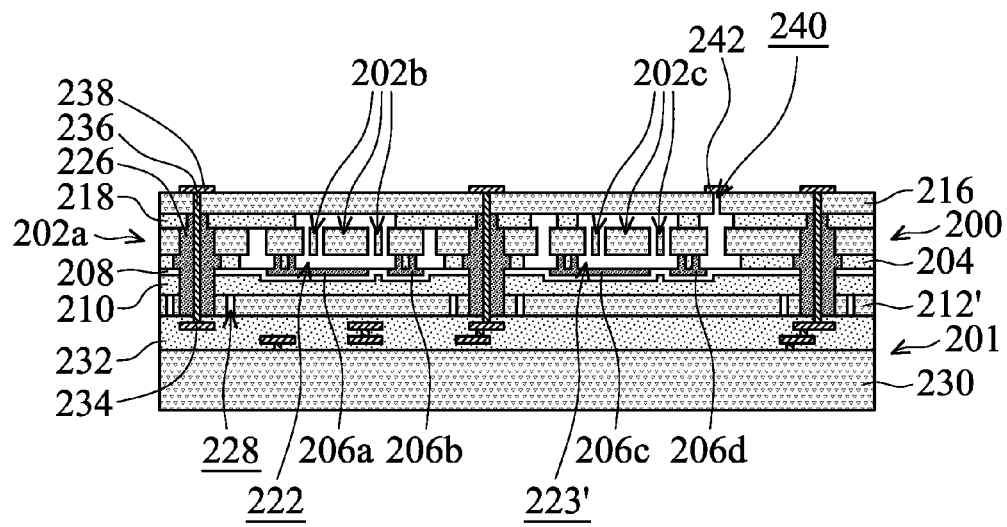
Figure 2Q:
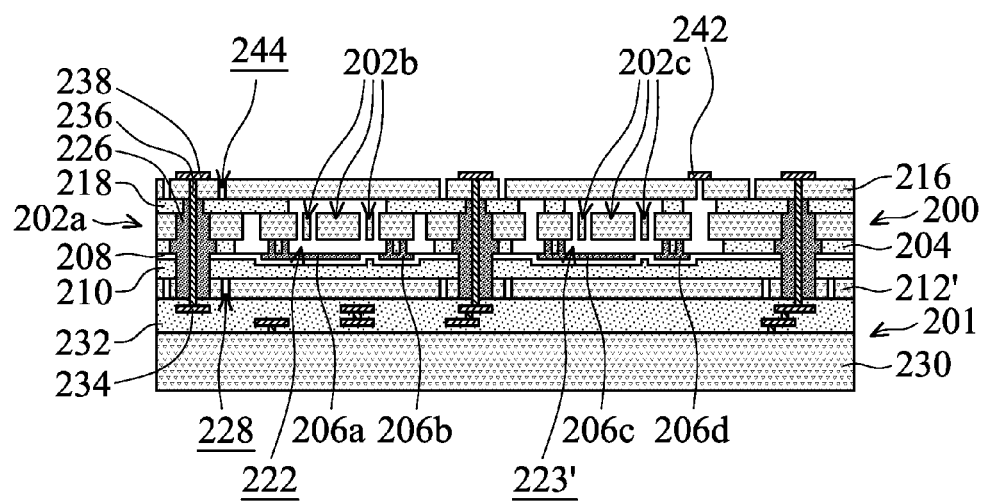

As shown in FIG. 2P, the cavities 223 is vacuumized and sealed by a sealing element 242 to form a closed chamber 223', in accordance with some embodiments. The sealing element 242 may be made of a metal material, dielectric material, semiconductor material, other applicable materials, or combinations thereof. In some embodiments, a sealing layer is deposited over the cap substrate 216 and patterned to be the sealing element 242. The sealing layer is deposited by using a PVD process, CVD process, other applicable processes, or combinations thereof. In some embodiments, a portion of the sealing layer is deposited over the etch stop layer 208 below the release hole 240. In some embodiments, a metal material is deposited on the etch stop layer 208, and the metal material is aligned with the release hole 240. An upper portion of the sidewall of the release hole 240 may also be covered by the metal material.

In some embodiments, the structure shown in FIG. 2O is disposed into a deposition tool to deposit the sealing layer. The deposition tool may be a PVD deposition tool, such as a sputtering tool. The structure shown in FIG. 2I is disposed into a vacuumized process chamber of the deposition tool. After the deposition and patterning of the sealing element 242 as shown in FIG. 2P, a closed chamber 223' sealed by the sealing element 242 is formed. The closed chamber 223' may have a pressure in a range from about 10-7 torr to about 1.0 torr. In some embodiments, the pressures of the closed chambers 223' and 222 are different from each other. The pressure of the closed chamber 223' is lower than that of the closed chamber 222. A ratio of the pressure of the closed chamber 223' to the pressure of the closed chamber 222 may be in a range from about 10-11 to about 0.03.

In some embodiments, the sealing element 242 and the conductive pads 238 are formed simultaneously. That is, the conductive pads 238 are not limited to be formed during the stage shown in FIG. 2N. In some embodiments, a metal layer is deposited over the cap substrate 216 and patterned to be the sealing element 242 and the conductive pads 238 as shown in FIG. 2P. In these cases, the sealing element 242 and the conductive pads 238 are made of the same material.

As shown in FIG. 2Q, the cap substrate 216 is patterned to form openings 244 to separate the cap substrate 216 into a number of isolated elements, in accordance with some embodiments. A photolithography process and an etching process may be performed to partially remove the cap substrate 216 and pattern the cap substrate 216 for isolation. The structure shown in FIG. 2Q may also be diced to form multiple MEMS devices separated from each other.

As shown in FIG. 2Q, the blocking layer 212' and the second blocking layer 226 are formed between the closed chambers (including the closed chambers 222 and 223') and the dielectric layer 232 of the CMOS substrate 201. The second blocking layer 226 and the etch stop layer 208 surrounds the closed chambers to prevent gas from entering the closed chambers. Therefore, any gas coming from the dielectric layer 232 is blocked from entering the closed chambers 222 and 223'. The degrees of vacuum of the closed chambers 222 and 223' are maintained.

In some embodiments, the blocking layer 212' and the second blocking layer 226 are made of different materials. For example, the blocking layer 212' is made of single crystal silicon, and the second blocking layer 226 is made of polysilicon.

The dielectric layers 204, 210, and 218 have been annealed at the high temperature. Therefore, there is almost no gas, coming from the dielectric layers 204, 210, and 218, would enter the closed chambers 222 and 223'. As shown in FIG. 2Q, the etch stop layer 208 may also function as a blocking layer to maintain the degree of vacuum of the closed chambers 222 and 223'. Since the degree of vacuum is maintained, the performance of the MEMS device is greatly improved.

The MEMS device includes two or more closed chambers (222 and 223') with different pressures. Two or more MEMS elements with different functions are integrated in a single MEMS device. For example, the movable elements 202b in the closed chamber 222 are used for an accelerometer application, and the movable elements 202c in the closed chamber 223' are used for resonator and gyro applications. In some other embodiments, the movable elements, in different closed chambers with different degrees of vacuum, are used for other applications.

Figure 3A:
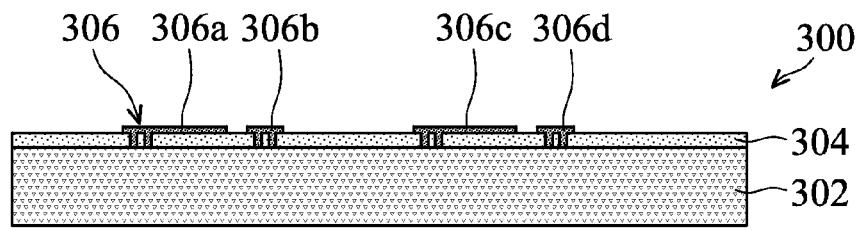
FIGS. 3A-3S are cross-sectional views of various stages of a process for forming a MEMS device, in accordance with some embodiments.

Embodiments of the disclosure have many variations. FIGS. 3A-3S are cross-sectional views of various stages of a process for forming a MEMS device, in accordance with some embodiments. Like reference numbers are used to designate like elements.

As shown in FIG. 3A, a MEMS substrate 300 (or a MEMS wafer) is provided, in accordance with some embodiments. The MEMS substrate 300 includes a semiconductor substrate 302. The semiconductor substrate 302 may be similar to the semiconductor substrate 202. As shown in FIG. 3A, a dielectric layer 304 is deposited over the semiconductor substrate 302. The material and the forming method of the dielectric layer 304 may be similar to those of the dielectric layer 204. The dielectric layer 304 is patterned to form one or more contact holes in the dielectric layer 304 to expose the semiconductor substrate 302.

As shown in FIG. 3A, a conductive layer 306 is deposited and patterned over the dielectric layer 304, in accordance with some embodiments. The material and the forming method of the conductive layer 306 may be similar to those of the conductive layer 206. The conductive layer 306 is patterned into multiple portions including portions 306a, 306b, 306c, and 306d, in accordance with some embodiments. Each of these portions may function as a contact element and/or an electrode element. Some of these portions may be electrically connected with each other.

Figure 3B:
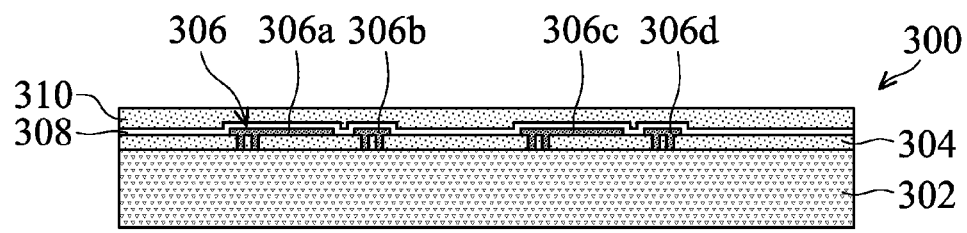

As shown in FIG. 3B, an etch stop layer 308 is deposited over the dielectric layer 304 and the conductive layer 306, in accordance with some embodiments. The etch stop layer 308 may be conformally deposited over the dielectric layer 304 and the conductive layer 306. The material and the forming method of the etch stop layer 308 may be similar to those of the etch stop layer 208. Afterwards, a dielectric layer 310 is deposited over the etch stop layer 308, as shown in FIG. 3B. The material and the forming method of the dielectric layer 310 may be similar to those of the dielectric layer 210.

Figure 3C:
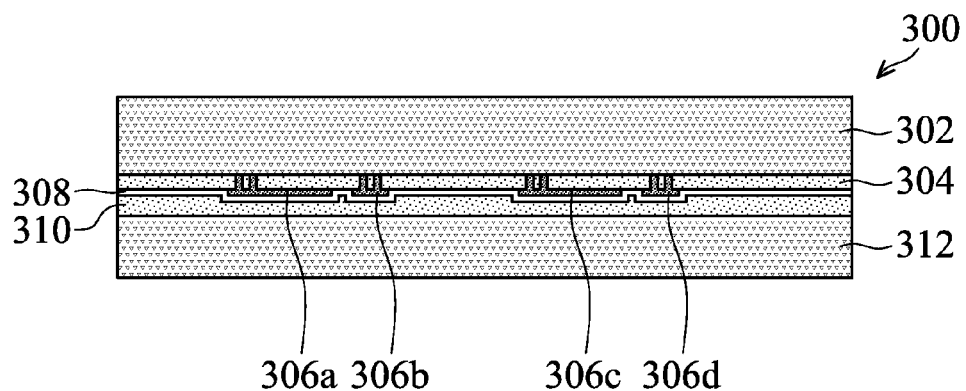

As shown in FIG. 3C, the MEMS substrate 300 is flipped upside down and bonded with a carrier substrate 312 (or a carrier wafer), in accordance with some embodiments. In subsequent operations, the carrier substrate 312 is thinned to be a blocking layer which is configured to block gas from penetrating through. The material of the carrier substrate 312 may be similar to that of the carrier substrate 212. The MEMS substrate 300 may be bonded with the carrier substrate 312 by using a method similar to that used for bonding the MEMS substrate 200 and the carrier substrate 212.

Figure 3D:
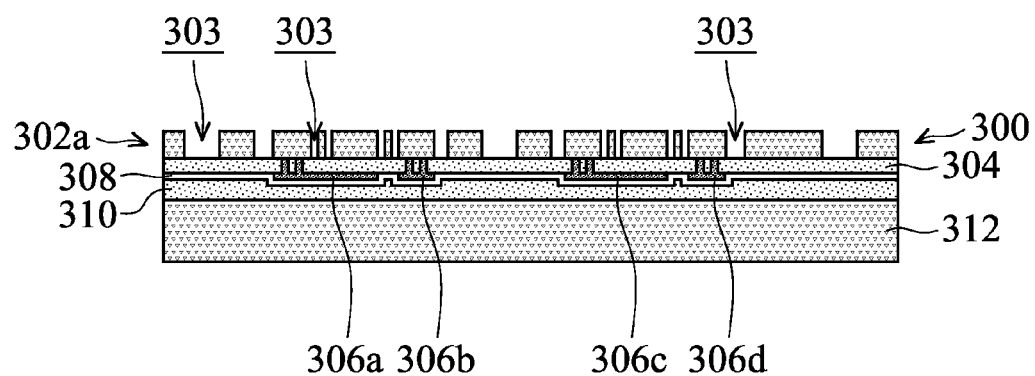

As shown in FIG. 3D, the semiconductor substrate 302 is thinned and patterned into a number of elements 302a, in accordance with some embodiments. The semiconductor substrate 302 may be thinned by using a mechanical grinding process, CMP process, etching process, other applicable processes, or combinations thereof. Afterwards, a portion of the thinned semiconductor substrate 302 is removed to form openings 303 which expose the dielectric layer 304. As a result, the thinned semiconductor substrate 302 is patterned to be the elements 302a. Some of the elements 302a connect with each other, and some of the elements do not connect with each other.

Figure 3E:
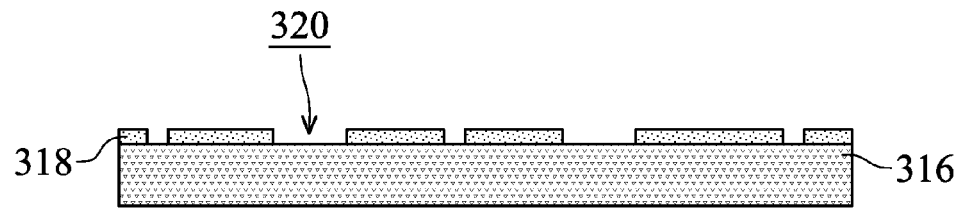

As shown in FIG. 3E, a cap substrate 316 (or cap wafer) and a patterned dielectric layer 318 formed over the cap substrate 316 are provided, in accordance with some embodiments. The materials of the cap substrate 316 and the dielectric layer 318 may be similar to those of the cap substrate 216 and the dielectric layer 218, respectively. The dielectric layer 318 is patterned to have a number of openings 320 which expose the cap substrate 316.

In some embodiments, the cap substrate 316 and the dielectric layer 318 are annealed at a high temperature to induce the outgassing of the dielectric layer 318. Therefore, the dielectric layer 318 contains less gas after being annealed. The degree of vacuum of a cavity or a closed chamber to be formed could be maintained more easily. For example, the cap substrate 316 and the dielectric layer 318 are annealed at a temperature ranging from about 900 degrees C. to about 1200 degrees C. for about 2 hours. Different annealing times may also be used. In some embodiments, the dielectric layer 318 is made of a thermal oxide or the like. In these cases, the annealing process may not be needed.

Figure 3F:
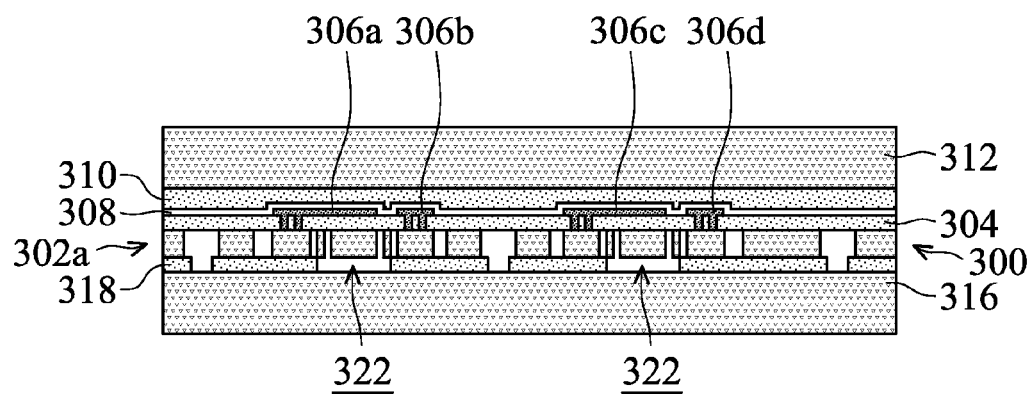

As shown in FIG. 3F, the structure shown in FIG. 3D is flipped upside down and bonded with the structure shown in FIG. 3E, in accordance with some embodiments. The elements 302a are bonded with the dielectric layer 318. The elements 302a may be in direct contact with the dielectric layer 318. The bonding between the elements 302a and the dielectric layer 318 may be achieved by using fusion bonding, eutectic bonding, plasma activated bonding, thermocompression bonding, diffusion bonding, anodic bonding, other applicable bonding, or combinations thereof.

As shown in FIG. 3F, a number of closed chambers 322 are formed between the cap substrate 316 and the carrier substrate 312 after the bonding between the elements 302a and the dielectric layer 318. Each of the closed chambers 322 is a combination of one of the openings 303 and one of the openings 320. The elements 302a are surrounded by the closed chambers 322. Some of the closed chambers 322 are connected to each other. Some of the closed chambers 322 are isolated from each other.

Figure 3G:
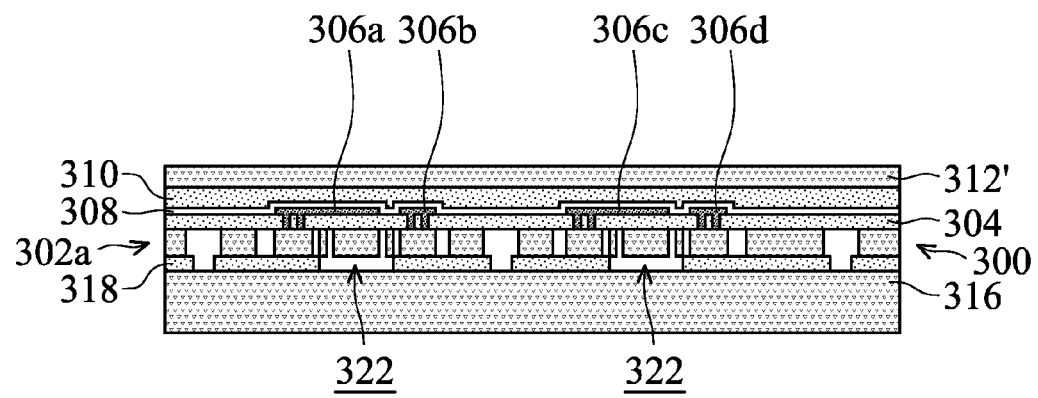

As shown in FIG. 3G, the carrier substrate 312 is thinned to be a blocking layer 312', in accordance with some embodiments. The blocking layer 312' is configured to block gas from penetrating through the blocking layer 312'. The blocking layer 312' may have a thickness in a range from about 2 μm to about 10 μm. In some other embodiments, the carrier substrate 312 is not thinned. In these cases, the carrier substrate 312 can also function as a blocking layer.

Figure 3H:
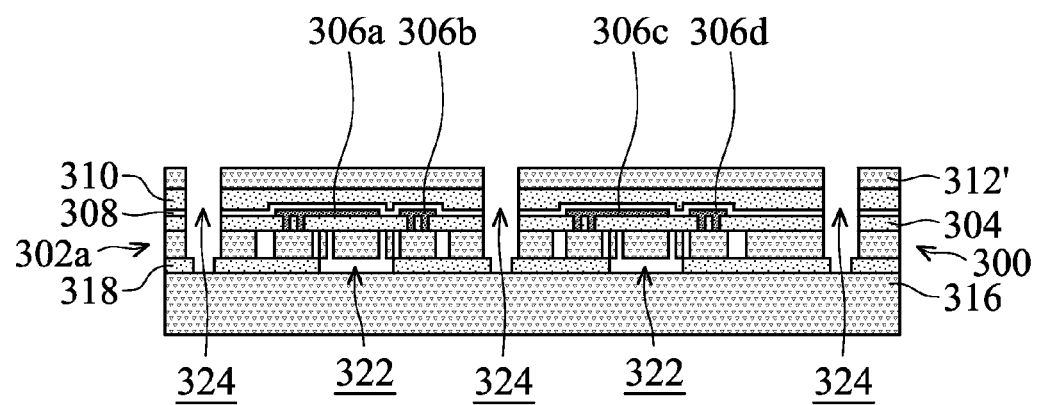

As shown in FIG. 3H, portions of the blocking layer 312', the dielectric layer 310, the etch stop layer 308, and the dielectric layer 304 are removed to form openings 324, in accordance with some embodiments. The openings 324 open some of the closed chambers 322 and expose the cap substrate 316. In some embodiments, a photolithography process and multiple etching processes are performed to form the openings 324. For example, a first etching process is performed to partially remove the blocking layer 312' to form through holes until the dielectric layer 310 is exposed. Afterwards, a second etching process is performed to partially remove the dielectric layer 310, the etch stop layer 308, and the dielectric layer 304. The dielectric layer 310, the etch stop layer 308, and the dielectric layer 304 may be etched in a single etching operation. For example, a suitable etchant, such as a mixture of CF4 and O2, may be used. As a result, the openings 324 are formed. Different etchants may be used in the first and second etching processes. An annealing process may then be performed at a temperature ranging from about 900 degrees C. to about 1200 degrees C. for about 2 hours. Different annealing times may also be used.

Figure 3I:
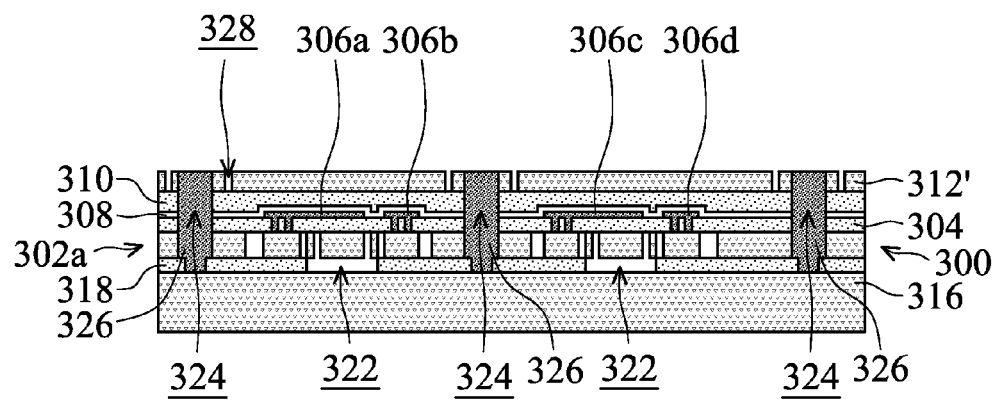

As shown in FIG. 3I, a second blocking layer 326 is deposited over the blocking layer 312' to fill the openings 324, in accordance with some embodiments. The second blocking layer 326 may be used to stop the gas coming from dielectric layers, such as those of a CMOS substrate (not shown in FIG. 3I) to be bonded with the MEMS substrate 300. The material and the forming method of the second blocking layer 326 may be similar to those of the second blocking layer 226.

If the blocking layer 312' and the second blocking layer 326 are electrically conductive, the blocking layer 312' may be patterned to form recesses 328 to separate the blocking layer 312' and the second blocking layer 326 into multiple isolated portions. Therefore, short circuiting is prevented. In some embodiments, each of the blocking layer 312' and the second blocking layer 326 also functions as an electrical shielding. Electromagnetic interference caused by neighboring elements, such as those of a CMOS substrate (not shown in FIG. 3I) to be bonded with the MEMS substrate 300, may be prevented by the blocking layer 312' and the second blocking layer 326.

Figure 3J:
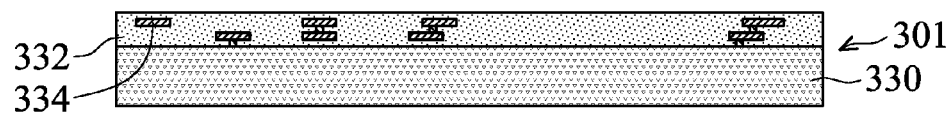

As shown in FIG. 3J, a CMOS substrate 301 (or a CMOS wafer) is provided, in accordance with some embodiments. The CMOS substrate 301 includes a semiconductor substrate 330 and a dielectric layer 332. The dielectric layer 332 includes multiple dielectric layers. Multiple conductive features (such as lines, vias, and contacts) are formed in the dielectric layer 332. The conductive features include conductive pads 334. Each of the conductive pads 334 is electrically connected to a region or a device element formed in/on the semiconductor substrate 330. In some embodiments, the dielectric layer 332 has a planarized top surface, which is, for example, a planarized oxide surface. The conductive pads 334 (or the top metal) may be buried under the planarized top surface.

Figure 3K:
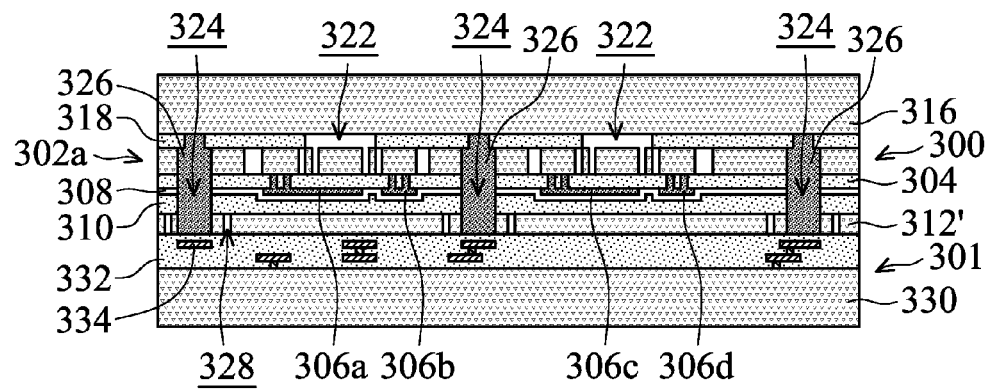

As shown in FIG. 3K, the MEMS substrate 300 and the CMOS substrate 301 are aligned and bonded with each other, in accordance with some embodiments. A fusion bonding process or other applicable processes may be performed to bond the planarized top surface of the dielectric layer 332 with the blocking layer 312' and the second blocking layer 326. In some embodiments, both the blocking layer 312' and the second blocking layer 326 are in direct contact with the dielectric layer 332. Some of the conductive pads 334 are substantially aligned with the second blocking layer 326 filling the openings 324.

Figure 3L:
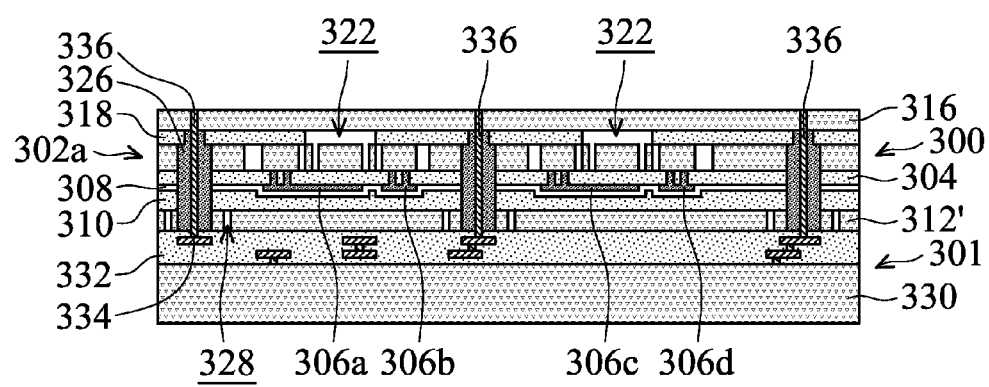

Afterwards, as shown in FIG. 3L, the cap substrate 316 is thinned, in accordance with some embodiments. The cap substrate 316 is thinned by using a suitable process. The suitable process may include a mechanical grinding process, CMP process, etching process, other applicable processes, or combinations thereof.

As shown in FIG. 3L, conductive plugs 336 are formed to electrically and respectively connect to the conductive pads 334, in accordance with some embodiments. Each of the conductive plugs 336 penetrates through the cap substrate 316, the second blocking layer 326, and the dielectric layer 332 to electrically contact with the corresponding one of the conductive pads 334. In some embodiments, the conductive plugs 336 are in direct contact with the second blocking layer 326. Each of the conductive plugs 336 may have a single width. The material and the forming method of the conductive plugs 336 may be similar to those of the conductive plugs 236.

Figure 3M:
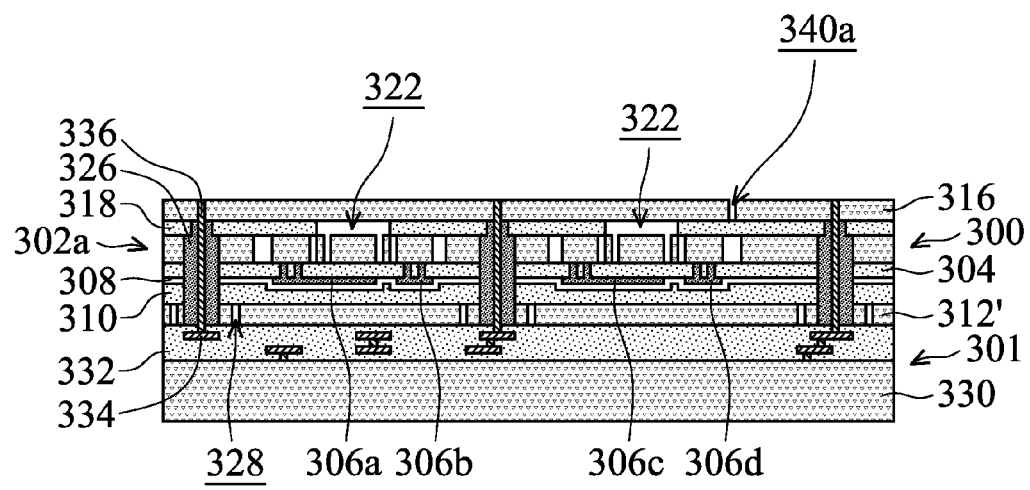

As shown in FIG. 3M, one or more release holes 340a are formed in the cap substrate 316 to expose the dielectric layer 318, in accordance with some embodiments. A photolithography process and an etching process may be performed to form the release hole(s) 340a. In some embodiments, a single release hole 340a is formed in the cap substrate 316.

Figure 3N:
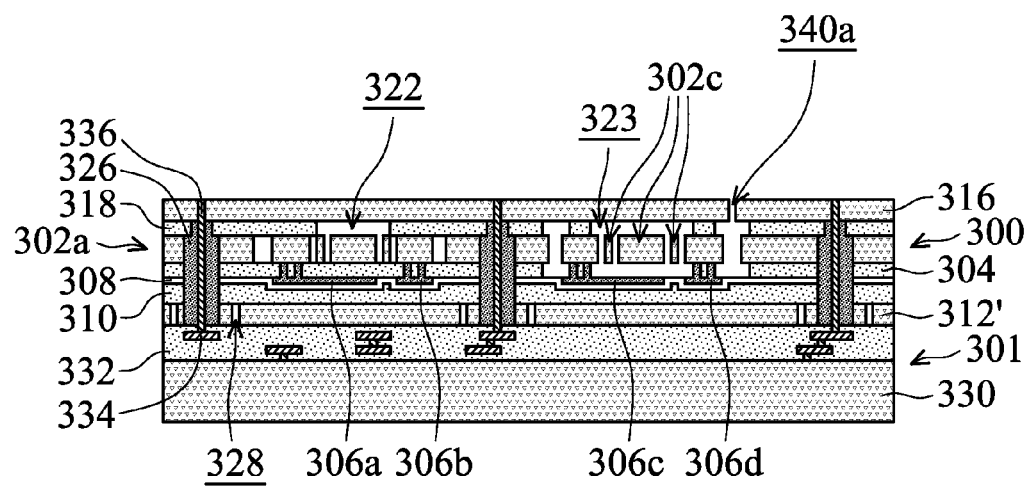

As shown in FIG. 3N, a portion of the dielectric layer 318 is removed through the release hole(s) 340a such that the closed chamber 322 is open to form a cavity 323, in accordance with some embodiments. An etching process is performed to form the cavity 323. As a result, some of the elements 302a are released from the dielectric layer 318 and become movable elements including movable elements 302c. A portion of the dielectric layer 318 originally surrounding the closed chamber 322 is now removed such that the movable elements 302c surrounded by the cavity 323 are free to move.

Figure 3O:
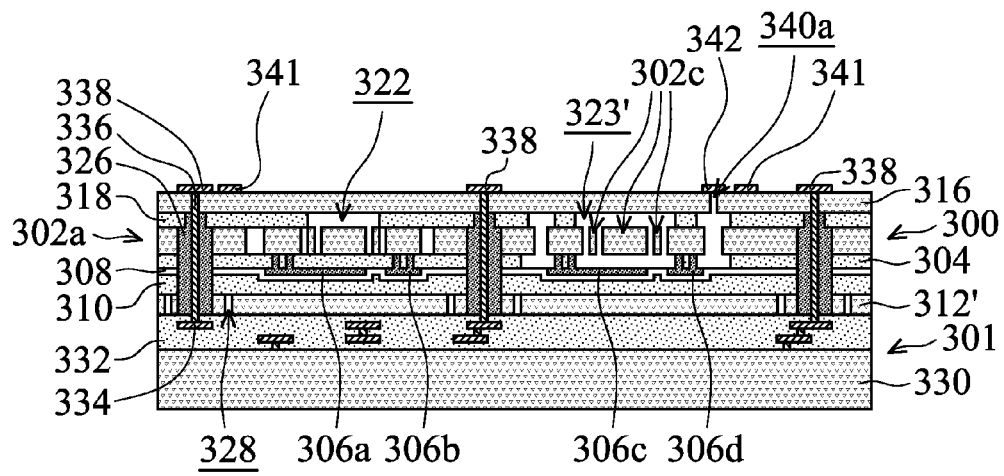

As shown in FIG. 3O, the cavity 323 is vacuumized and sealed by a sealing element 342 to form a closed chamber 323', in accordance with some embodiments. The material and the forming method of the sealing element 342 may be similar to those of the sealing element 242. In some embodiments, the structure shown in FIG. 3N is disposed into a deposition tool to deposit a sealing layer for forming the sealing element 342. The deposition tool may be a PVD deposition tool, such as a sputtering tool. The structure shown in FIG. 3N is disposed into a vacuumized process chamber of the deposition tool. After the deposition and patterning of the sealing element 342 as shown in FIG. 3O, a closed chamber 323' sealed by the sealing element 342 is formed. The closed chamber 323' may have a pressure in a range from about 10-7 torr to about 1.0 torr.

As shown in FIG. 3O, conductive pads 338 and bonding elements 341 are formed over the cap substrate 316, in accordance with some embodiments. The conductive pads 338 are electrically connected to the conductive plugs 336, respectively. The conductive pads 338 may be in direct contact with the conductive plugs 336, respectively. The bonding elements 341 are used for bonding with a second cap substrate which will be described later.

In some embodiments, the sealing element 342, the conductive pads 338, and the bonding elements 341 are formed simultaneously. In some embodiments, a metal layer is deposited over the cap substrate 316 and patterned to be the sealing element 342, the conductive pads 338, and the bonding elements 341 as shown in FIG. 3O. In these cases, the sealing element 342, the conductive pads 338, and the bonding elements 341 are made of the same material.

Figure 3P:
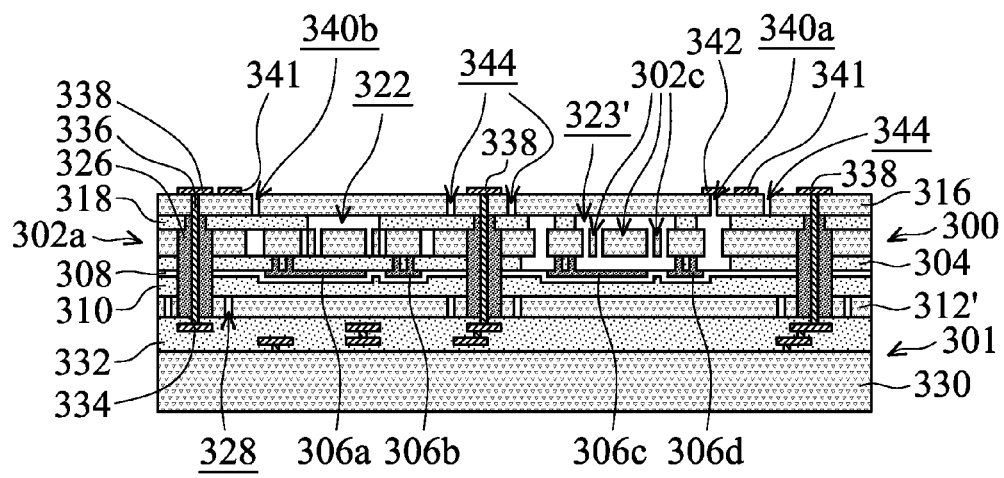

As shown in FIG. 3P, one or more release holes 340b are formed in the cap substrate 316 to expose the dielectric layer 318, in accordance with some embodiments. Openings 344 may also be formed in the cap substrate 316 to separate the cap substrate 316 into a number of isolated elements to prevent short circuiting. In some embodiments, the release hole(s) 340b and the openings 344 are formed simultaneously. A photolithography process and an etching process may be performed to form the release hole(s) 340b and the openings 344. In some embodiments, a single release hole 340a is formed in the cap substrate 316.

Figure 3Q:
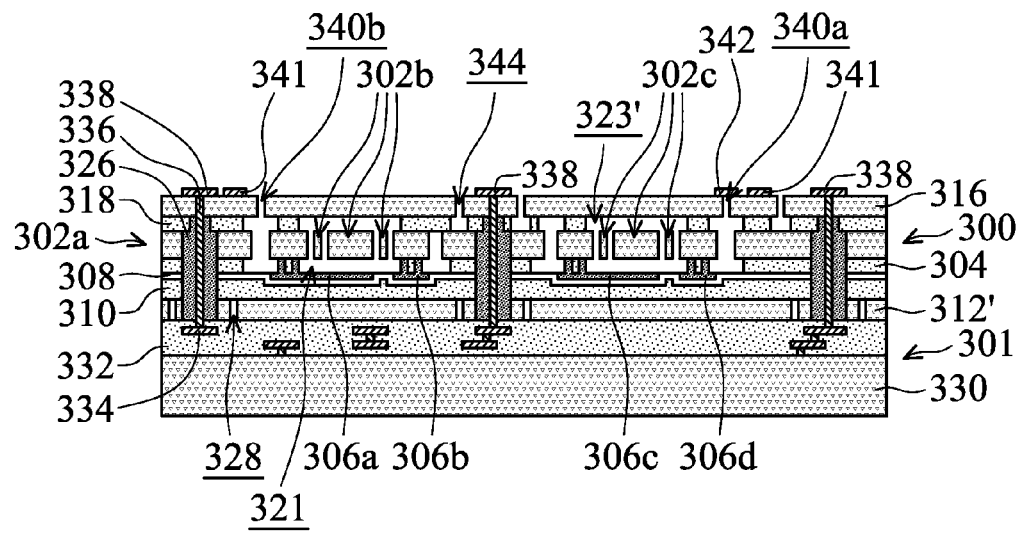

As shown in FIG. 3Q, a portion of the dielectric layer 318 is removed through the release hole(s) 340b such that the closed chamber 322 is open to be a cavity 321, in accordance with some embodiments. A portion of the dielectric layer 318 under the openings 344 is also removed. An etching process is performed to form the cavity 322. As a result, some of the elements 302a are released from the dielectric layer 318 and become movable elements including movable elements 302b. A portion of the dielectric layer 318 originally surrounding the closed chamber 322 is now removed such that the movable elements 302b surrounded by the cavity 321 are free to move.

Figure 3R:
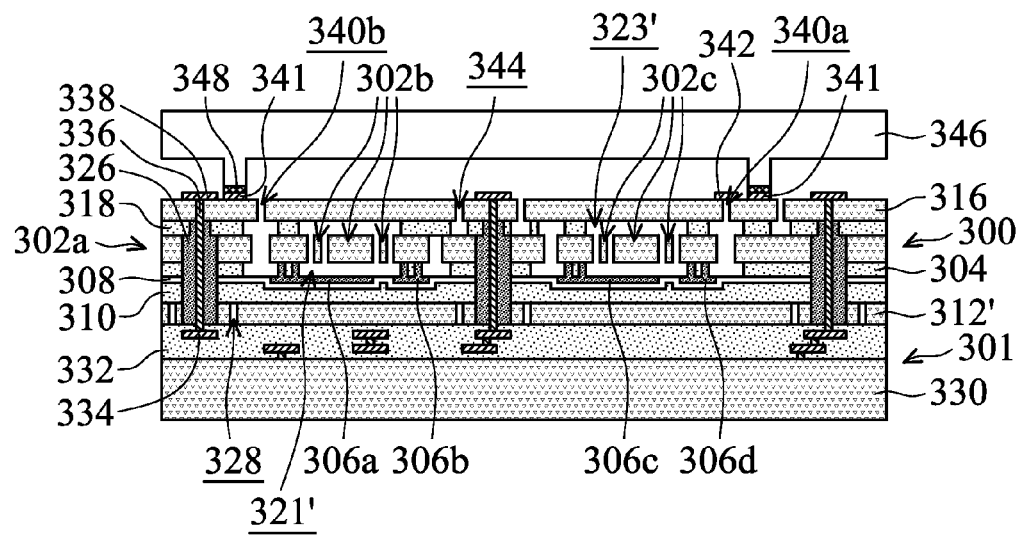
Figure 3S:
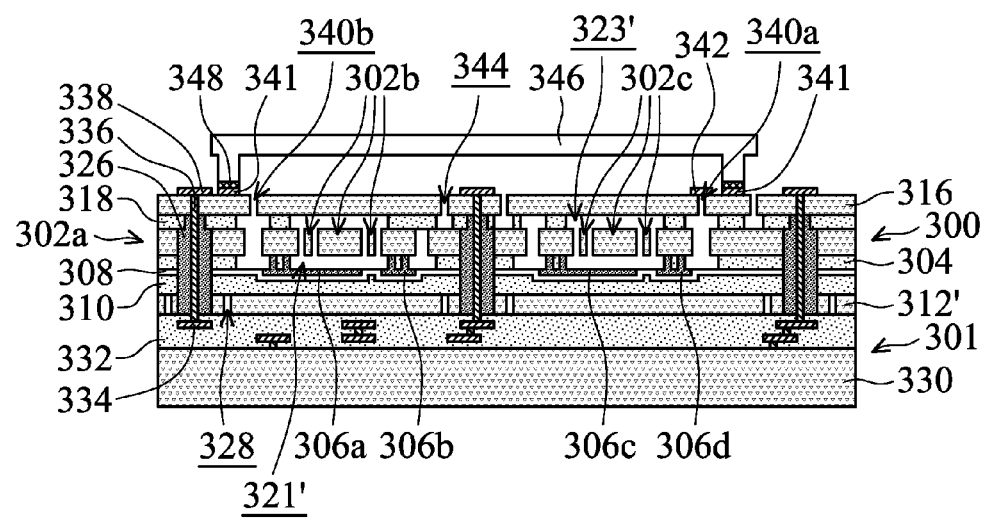

As shown in FIG. 3R, a second cap substrate 346 is bonded with the cap substrate 316 to close and/or seal the cavity 321 and form a closed chamber 321', in accordance with some embodiments. The second closed chambers 321' is between the second cap substrate 346 and the MEMS substrate 300. As shown in FIG. 3R, the closed chamber 321' is surrounded by the second cap substrate 346, the cap substrate 316, and the MEMS substrate 300. A portion of the closed chamber 321' between the cap substrates 316 and 346 is overlying the closed chamber 323'.

The second cap substrate 346 may be a semiconductor substrate or other suitable substrate, such as a glass substrate. The second cap substrate 346 may be bonded with the cap substrate 316 by using an applicable bonding process, such as a eutectic bonding process. Bonding elements 348 are formed over the second cap substrate 346 and are used to be bonded with the bonding elements 341 previously formed over the cap substrate 316. In some embodiments, the bonding elements 348 are made of a semiconductor material such as germanium or the like, and the bonding elements 341 are made of a metal material such as aluminum or the like.

The bonding process may be performed in a process chamber, which has a predetermined pressure, of a bonding tool. As a result, the closed chambers 321' formed in the process chamber would also have substantially the same pressure. In some embodiments, the pressure of each of the closed chambers 321' is in a range from about 0.05 atm to about 3 atm. The pressure of the closed chambers 321' may be adjusted by tuning the pressure of the process chamber.

In some embodiments, the pressures of the closed chambers 323' and 321' are different from each other. The pressure of the closed chamber 323' is lower than that of the closed chamber 321'. A ratio of the pressure of the closed chamber 323' to the pressure of the closed chamber 321' may be in a range from about 10-11 to about 0.03.

As shown in FIG. 3S, the second cap substrate 346 is thinned and patterned such that some of the conductive pads 338 are exposed, in accordance with some embodiments. The second cap substrate 346 may be thinned before being patterned. The second cap substrate 346 may be patterned by using a dicing saw. The structure shown in FIG. 3S may also be diced to form multiple MEMS devices separated from each other.

As shown in FIG. 3S, the blocking layer 312' and the second blocking layer 326 are formed between the closed chambers (including the closed chambers 321' and 323') and the dielectric layer 332 of the CMOS substrate 301. The second blocking layer 326 and the etch stop layer 308 surrounds the closed chambers to prevent gas from entering the closed chambers. Therefore, any gas coming from the dielectric layer 332 is blocked from entering the closed chambers 321' and 323'. The degrees of vacuum of the closed chambers 321' and 323' are maintained.

The dielectric layers 304, 310, and 318 have been annealed at the high temperature. Therefore, there is almost no gas, coming from the dielectric layers 304, 310, and 318, would enter the closed chambers 321' and 323'. As shown in FIG. 3S, the etch stop layer 308 may also function as a blocking layer to maintain the degree of vacuum of the closed chambers 321' and 323'. Since the degree of vacuum is maintained, the performance of the MEMS device is greatly improved.

The MEMS device includes two or more closed chambers (321' and 223') with different pressures. Two or more MEMS elements with different functions are integrated in a single MEMS device. For example, the movable elements 302b in the closed chamber 321' are used for an accelerometer application, and the movable elements 302c in the closed chamber 323' are used for resonator and gyro applications. In some other embodiments, the movable elements, in different closed chambers with different degrees of vacuum, are used for other applications.

Embodiments of mechanisms for forming a MEMS device described above form two or more closed chambers with different degrees of vacuum. Two or more MEMS elements with different functions are therefore integrated in the same MEMS device. Multiple blocking layers are between dielectric layers of a CMOS substrate and the closed chambers. An etch stop layer, such as a low stress nitride layer, could also be used to block gas outside of the closed chambers. Before bonding with the CMOS substrate, a MEMS substrate is annealed at a high temperature to reduce gas coming from dielectric layers of the MEMS substrate. Therefore, the degrees of vacuum of the closed chambers are appropriately maintained. The performance and functions of the MEMS device are significantly improved.

In accordance with some embodiments, a MEMS device is provided. The MEMS device includes a CMOS substrate, a cap substrate, and a MEMS substrate bonded between the CMOS substrate and the cap substrate. The MEMS substrate includes a first movable element and a second movable element. The MEMS device also includes a first closed chamber and a second closed chamber, which are between the MEMS substrate and the cap substrate. The first movable element is in the first closed chamber, and the second movable element is in the second closed chamber. A first pressure of the first closed chamber is higher than a second pressure of the second closed chamber.

In accordance with some embodiments, a MEMS device is provided. The MEMS device includes a CMOS substrate, a first cap substrate, and a second cap substrate bonded with the first cap substrate. The MEMS device also includes a MEMS substrate bonded between the CMOS substrate and the first cap substrate. The MEMS substrate includes a first movable element and a second movable element, and the first cap substrate is between the second cap substrate and the MEMS substrate. The MEMS device further includes a first closed chamber between the MEMS substrate and the second cap substrate, and the first movable element is in the first closed chamber. In addition, the MEMS device includes a second closed chamber between the MEMS substrate and the first cap substrate, and the second movable element is in the second closed chamber. A first pressure of the first closed chamber is higher than a second pressure of the second closed chamber.

In accordance with some embodiments, a method for forming a MEMS device is provided. The method includes forming a dielectric layer over a semiconductor substrate and bonding the dielectric layer with a carrier substrate. The method also includes patterning the semiconductor substrate into a plurality of elements and partially removing the dielectric layer to release some of the elements. The released elements become a first movable element and a second movable element. The method further includes bonding a cap substrate with the semiconductor substrate to form a first closed chamber and a second closed chamber between the semiconductor substrate and the cap substrate. In addition, the method includes bonding a CMOS substrate with the carrier substrate and removing a portion of the cap substrate to open the second closed chamber. The method also includes vacuumizing and sealing the second closed chamber such that the second closed chamber has a second pressure after the second closed chamber is open. A first pressure of the first closed chamber is higher than the second pressure, and the first movable element and the second movable element are in the first closed chamber and the second closed chamber, respectively.

In the embodiments mentioned above, a MEMS device having closed chambers with different pressures is provided. One of the closed chambers is open and then sealed to achieve a different pressure. However, it should be appreciated that embodiments of the disclosure are not limited thereto. In some embodiments, the closed chambers are not open and sealed to form closed chambers with different pressures. In some embodiments, a pressure-changing layer (or a pressure-changing element) is formed before the closed chambers are formed. After the closed chambers of the MEMS device are formed, the pressure-changing layer changes the pressure of one of the closed chambers. As a result, the MEMS device having the closed chambers with different pressures is formed. Fabrication cost and time may be reduced significantly.

Figure 4A:
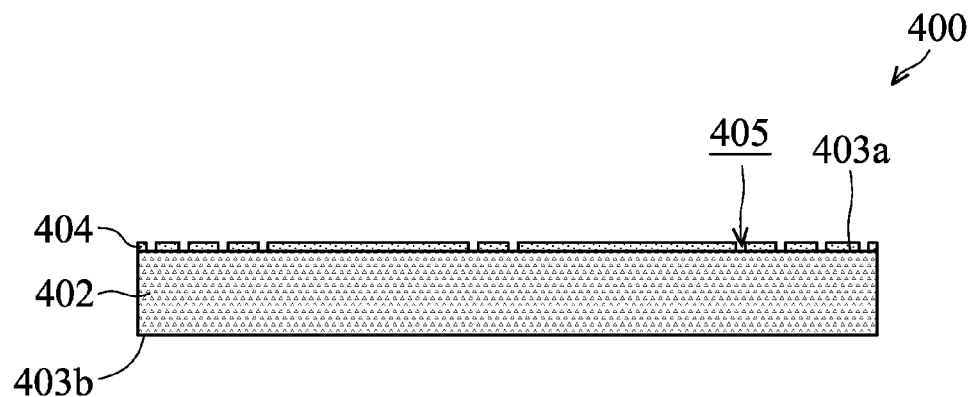
FIG. 4A-4N are cross-sectional views of various stages of a process for forming a MEMS device, in accordance with some embodiments.
Figure 4B:
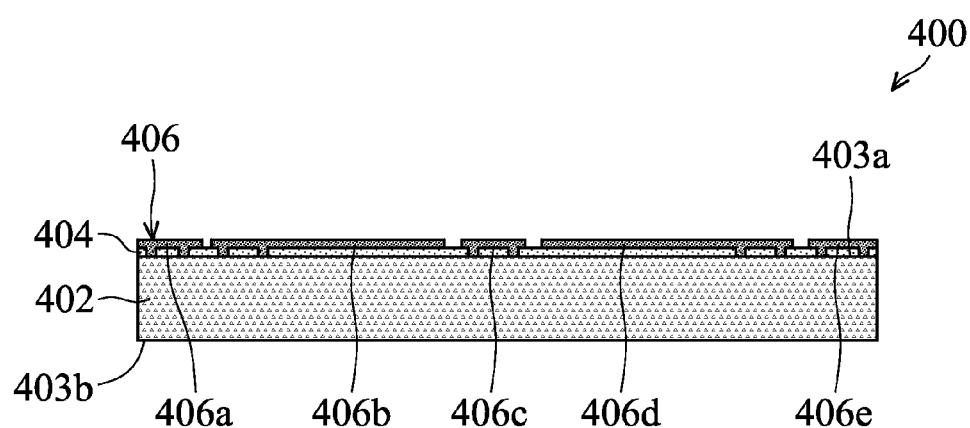
Figure 4C:
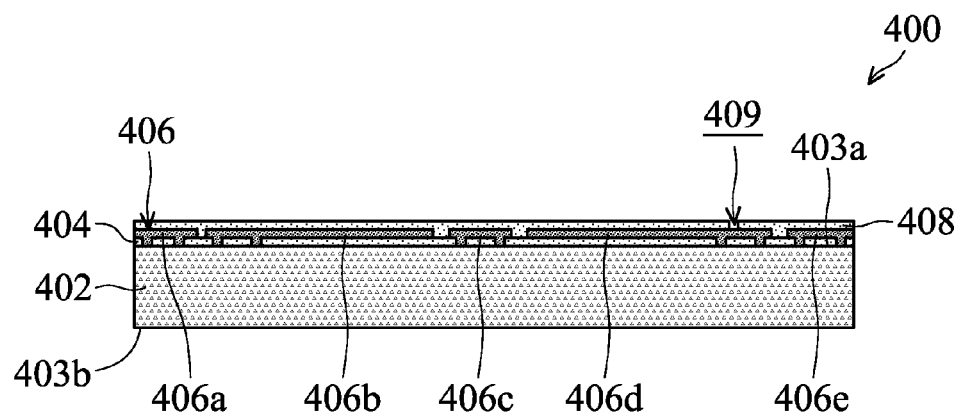
Figure 4D:
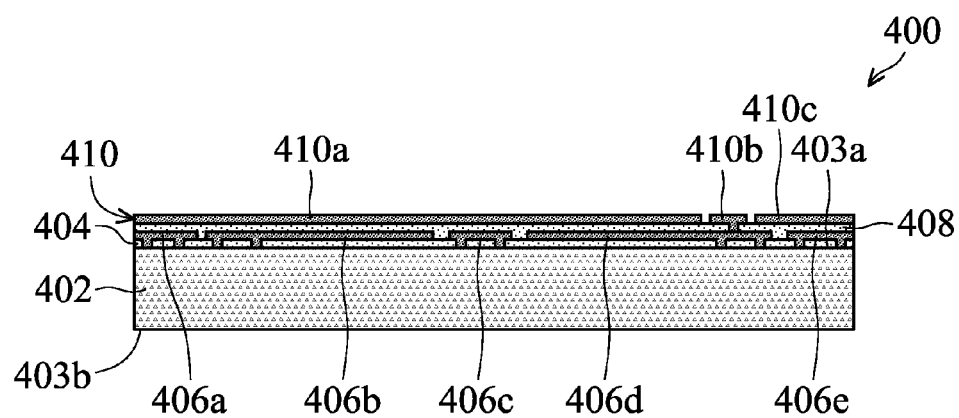
Figure 4E:
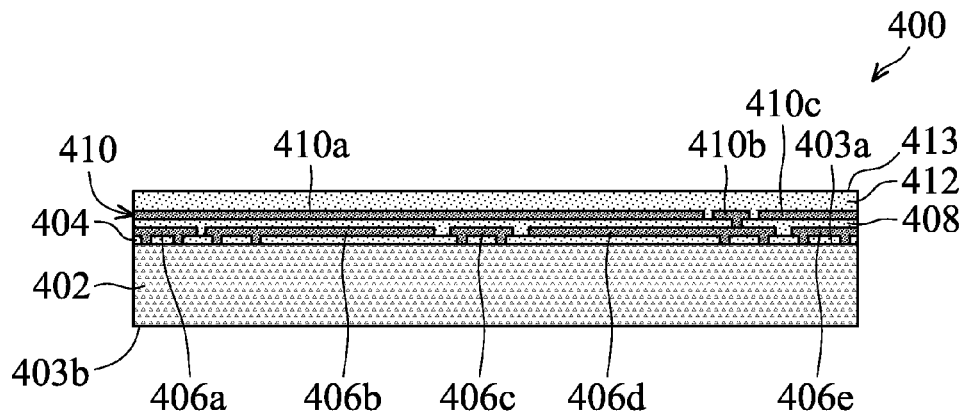
Figure 4F:
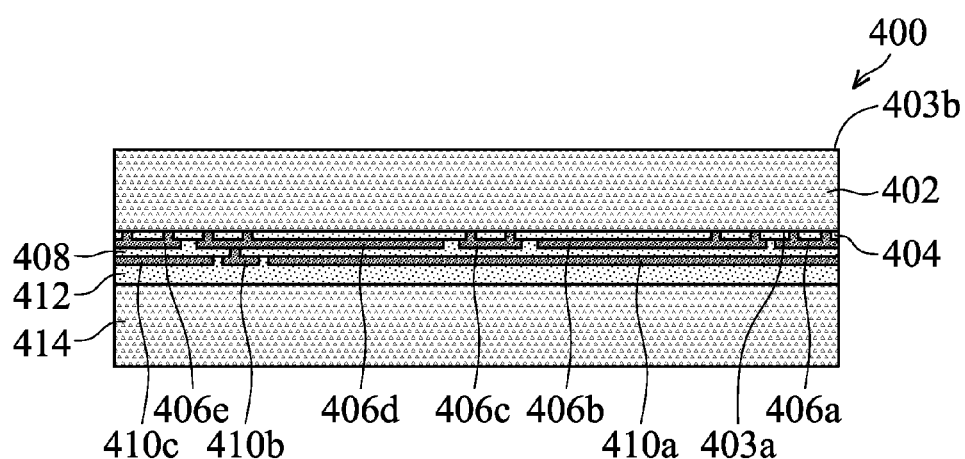
Figure 4G:
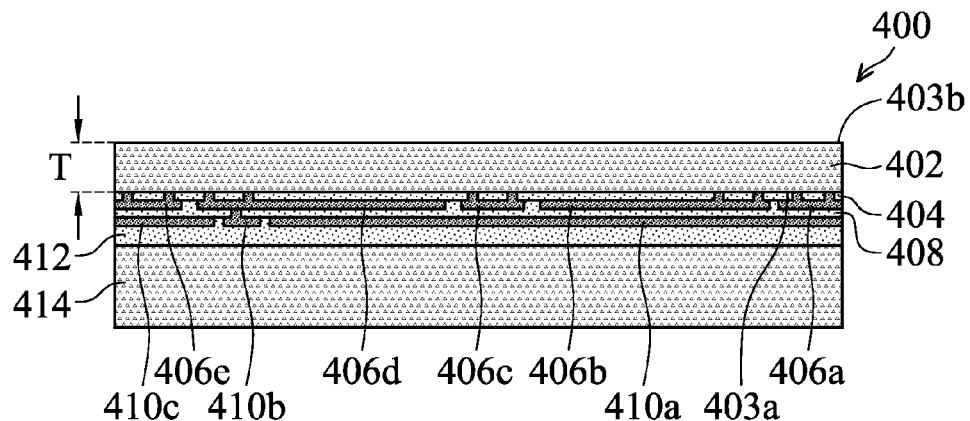
Figure 4H:
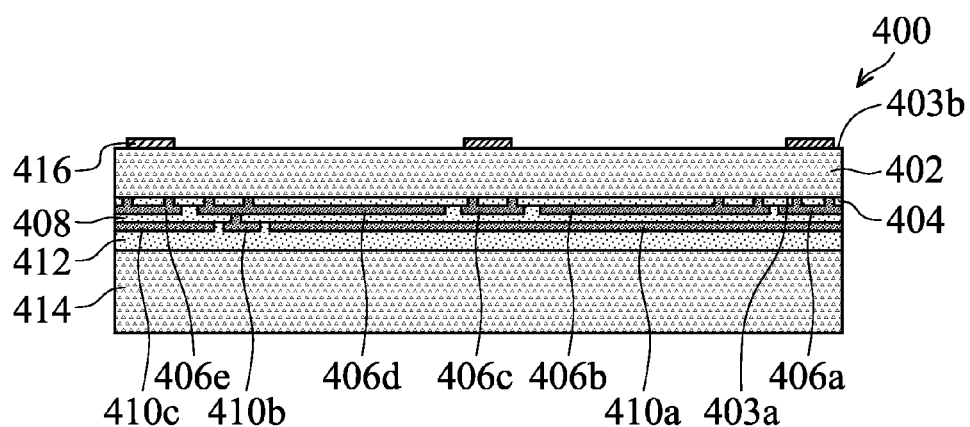
Figure 4I:
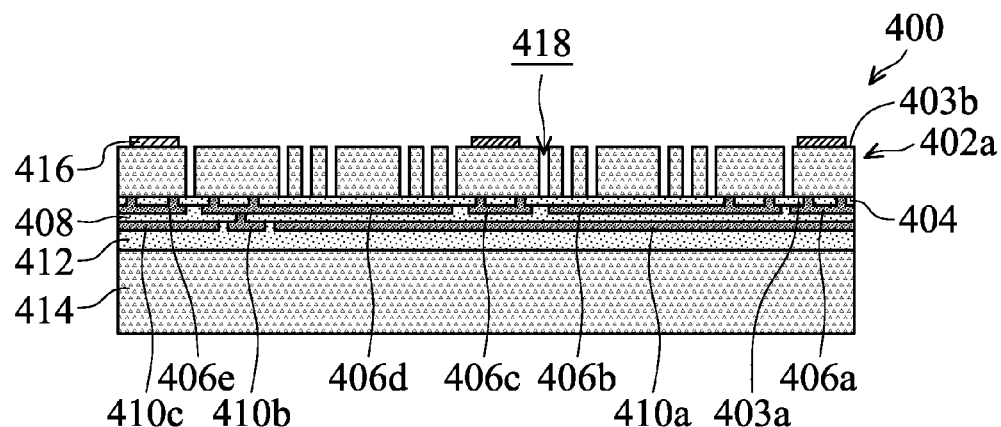
Figure 4J:
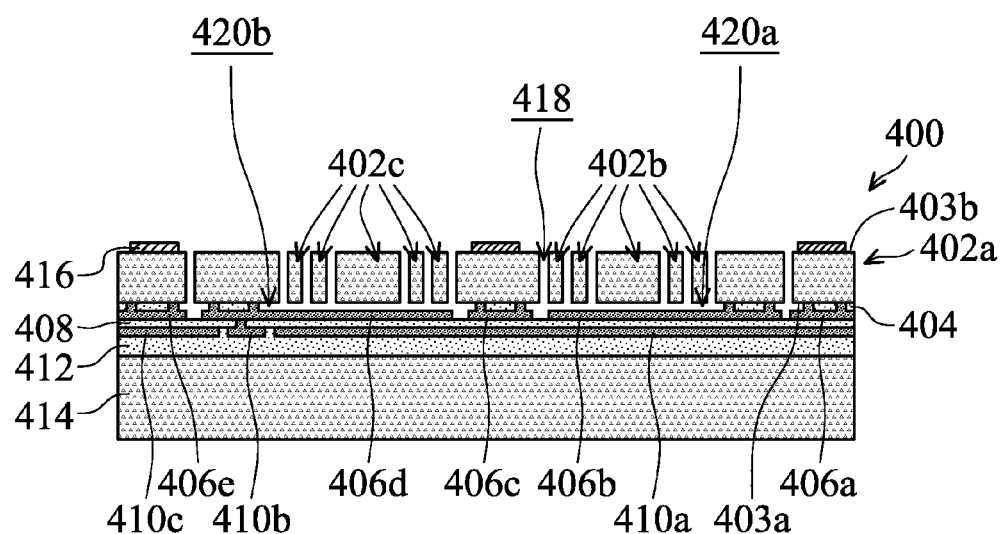
Figure 4K:
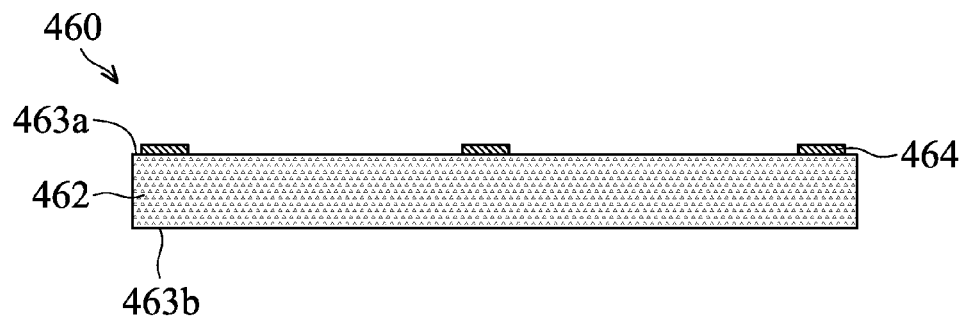
Figure 4L:
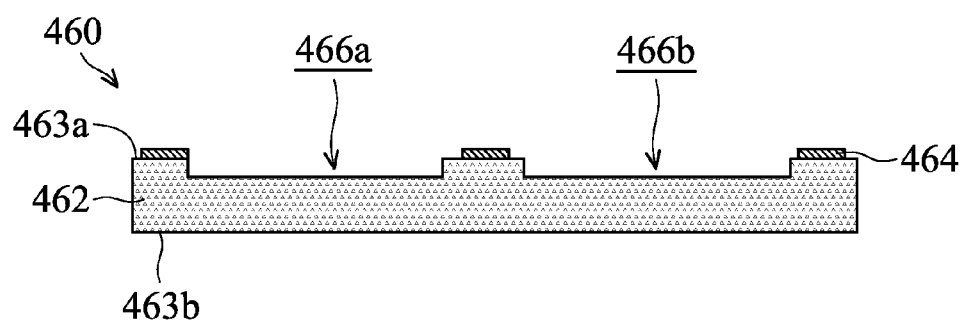
Figure 4M:
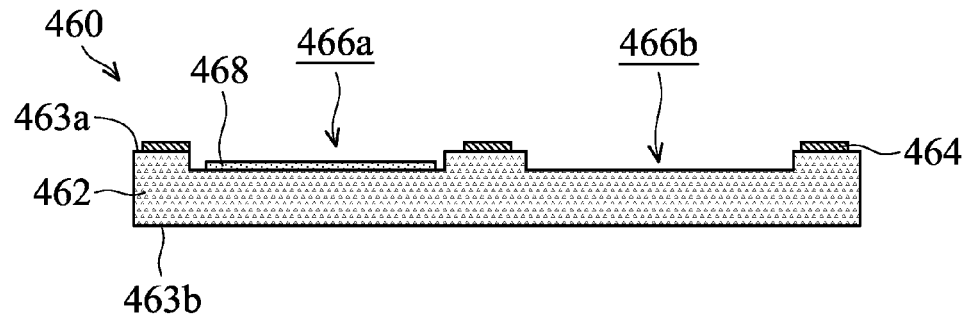
Figure 4N:
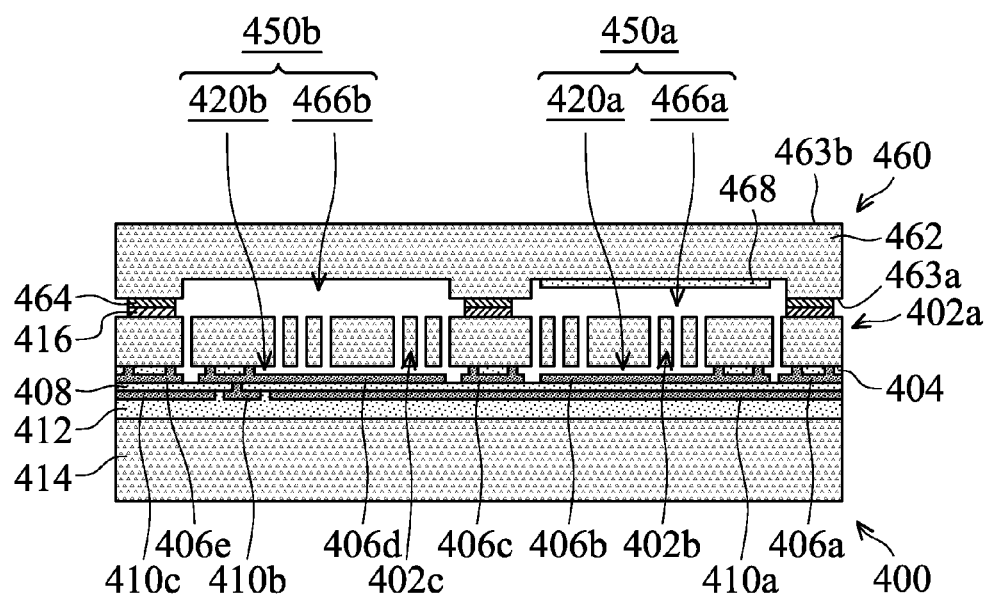

FIGS. 4A-4N are cross-sectional views of various stages of a process for forming a MEMS device, in accordance with some embodiments. FIGS. 4A-4J shows various stages of a process for forming a MEMS substrate 400 of the MEMS device, in accordance with some embodiments. As shown in FIG. 4A, a semiconductor substrate 402 is provided. The semiconductor substrate 402 has opposite surfaces 403a and 403b. In some embodiments, the semiconductor substrate 402 is similar to the semiconductor substrate 202 shown in FIG. 2A. For example, the semiconductor substrate 402 is a silicon wafer.

As shown in FIG. 4A, a dielectric layer 404 is deposited and patterned over the surface 403a of the semiconductor substrate 402, in accordance with some embodiments. In some embodiments, the dielectric layer 404 is made of silicon oxide, silicon nitride, silicon oxynitride, other suitable materials, or a combination thereof. In some embodiments, the dielectric layer 404 is deposited using a CVD process, a thermal oxidation process, a spin-on process, other applicable processes, or a combination thereof. Afterwards, the dielectric layer 404 is patterned to form one or more contact holes 405, as shown in FIG. 4A in accordance with some embodiments. In some embodiments, the contact holes 405 expose the semiconductor substrate 402. A photolithography process and an etching process may be used to form the contact holes 405. In some embodiments, the patterned dielectric layer 404 is annealed at a high temperature to induce outgassing of the dielectric layer 404. For example, the dielectric layer 404 is annealed at a temperature ranging from about 900 degrees C. to about 1200 degrees C. for about 2 hours. In some embodiments, the dielectric layer 404 is not annealed at this stage.

As shown in FIG. 4B, a conductive layer 406 is deposited and patterned over the dielectric layer 404 and the semiconductor substrate 402, in accordance with some embodiments. In some embodiments, the materials and formation methods of the conductive layer 406 are similar to those of the conductive layer 206. For example, the conductive layer 406 is made of polysilicon. In some embodiments, the conductive layer 206 is patterned into multiple portions including portions 406a, 406b, 406c, 406d, and 406e. Each of these portions may function as a contact element and/or an electrode element. Some of these portions may be electrically connected to each other. In some embodiments, some of these portions function as sensing electrodes and/or routing electrodes.

As shown in FIG. 4C, a dielectric layer 408 is deposited over the dielectric layer 404 and the conductive layer 406, in accordance with some embodiments. In some embodiments, the dielectric layer 408 is made of silicon oxide, silicon nitride, silicon oxynitride, other suitable materials, or a combination thereof. In some embodiments, the dielectric layer 408 is deposited using a CVD process, a spin-on process, other applicable processes, or a combination thereof. In some embodiments, a planarization process is performed on the dielectric layer 408 to provide the dielectric layer 408 with a substantially planar top surface. The planarization process includes, for example, a CMP process. Afterwards, the dielectric layer 408 is patterned to form one or more contact holes 409, as shown in FIG. 4C in accordance with some embodiments. In some embodiments, the dielectric layer 408 is annealed at a high temperature to induce outgassing of the dielectric layer 408. In some other embodiments, the dielectric layer 408 is not annealed at this stage.

As shown in FIG. 4D, a conductive layer 410 is deposited and patterned over the dielectric layer 408 and the conductive layer 406, in accordance with some embodiments. In some embodiments, the materials and formation methods of the conductive layer 406 are similar to those of the conductive layer 406. The conductive layer 410 is patterned into multiple portions, such as portions 410a, 410b, and 410c, as shown in FIG. 4D. In some embodiments, some of these portions are used for electrical routing, electrical shielding, or the like. In some embodiments, the portion 410b of the conductive layer 410 is electrically connected to the portion 406d of the conductive layer 406 through the contact hole formed in the dielectric layer 408.

As shown in FIG. 4E, a dielectric layer 412 is deposited over the conductive layer 410 and the dielectric layer 408, in accordance with some embodiments. In some embodiments, the dielectric layer 412 is made of silicon oxide, silicon nitride, silicon oxynitride, other suitable materials, or a combination thereof. In some embodiments, the dielectric layer 412 is deposited using a CVD process, a spin-on process, other applicable processes, or a combination thereof. In some embodiments, the dielectric layer 412 is planarized to have a substantially planar top surface 413. The substantially planar top surface 413 facilitates a subsequent bonding process between the dielectric layer 412 and a carrier substrate. In some embodiments, the dielectric layer 412 is annealed at a high temperature to induce outgassing of the dielectric layer 412. For example, the dielectric layer 412 is annealed at a temperature ranging from about 900 degrees C. to about 1200 degrees C. for about 2 hours.

As shown in FIG. 4F, the structure shown in FIG. 4E is flipped upside down and bonded with a carrier substrate 414, in accordance with some embodiments. In some embodiments, the carrier substrate 414 is made of a semiconductor material, a metal material, a dielectric material, other suitable material, or a combination thereof. In some embodiments, the carrier substrate 414 is a semiconductor wafer, such as a silicon wafer. In some embodiments, the carrier substrate 414 is in direct contact with the dielectric layer 412. The bonding between the carrier substrate 414 and the dielectric layer 412 may be achieved by using a fusion bonding process, a eutectic bonding process, a plasma activated bonding process, a thermocompression bonding process, a diffusion bonding process, an anodic bonding process, other applicable processes, or a combination thereof.

As shown in FIG. 4G, the semiconductor substrate 402 is thinned down from the surface 403b, in accordance with some embodiments. In some embodiments, a planarization process is performed to thin the semiconductor substrate 402 to a thickness T. In some embodiments, the thickness T is in a range from about 10 µm to about 60 µm. A suitable planarization process includes, for example, a CMP process, a mechanical grinding process, an etching process, other applicable processes, or a combination thereof.

As shown in FIG. 4H, one or more bonding elements 416 are formed over the surface 403b of the semiconductor substrate 402, in accordance with some embodiments. In some embodiments, the bonding element 416 is made of a metal material, a semiconductor material, other suitable materials, or a combination thereof. A suitable metal material for forming the bonding element 416 includes, for example, aluminum (Al), copper (Cu), aluminum copper (AlCu), gold (Au), the like, or a combination thereof. A suitable semiconductor material for forming the bonding element 416 includes, for example, germanium or the like. In some embodiments, a bonding material layer is deposited over the semiconductor substrate 402 using a PVD process, a plating process, a CVD process, other applicable processes, or a combination thereof. Afterwards, the bonding material layer is patterned to form the bonding elements 416, as shown in FIG. 4H.

As shown in FIG. 4I, the semiconductor substrate 402 is patterned to form a number of elements 402a, in accordance with some embodiments. In some embodiments, the semiconductor substrate 402 is partially removed to form a number of openings 418. In some embodiments, the openings 418 expose the dielectric layer 404. For example, a photolithography process and an etching process are used to partially remove the semiconductor substrate 402. In some embodiments, some of the elements 402a connect with each other, and some of other elements do not.

As shown in FIG. 4J, a portion of the dielectric layer 404 is removed through the openings 418 to form cavities including cavities 420a and 420b, in accordance with some embodiments. For example, an etching process is used to partially remove the dielectric layer 404. In some embodiments, a portion of the dielectric layer 408 is also removed. After the cavities 420a and 420b are formed, some of the elements 402a are released from the dielectric layer 404 and are free to move. In some embodiments, movable elements 402b and 402c are formed, as shown in FIG. 4J. The movable elements 402b and 402c are surrounded by the openings 418 and the cavities 420a or 420b.

FIGS. 4K-4M are cross-sectional views of various stages of a process for forming a cap substrate 460 of the MEMS device, in accordance with some embodiments. As shown in FIG. 4K, a substrate 462 is provided. The substrate 462 has opposite surfaces 463a and 463b. In some embodiments, the substrate 462 is made of a semiconductor material, a dielectric material, a metal material, other suitable materials, or a combination thereof. In some embodiments, the substrate 462 is transparent. In some other embodiments, the substrate 462 is not transparent.

As shown in FIG. 4K, one or more bonding elements 464 are formed over the surface 463a of the substrate 462 of the cap substrate 460, in accordance with some embodiments. In some embodiments, the bonding element 464 is made of a semiconductor material, a metal material, other suitable materials, or a combination thereof. A suitable semiconductor material for forming the bonding element 464 includes, for example, germanium or the like. A suitable metal material for forming the bonding element 464 includes, for example, aluminum (Al), copper (Cu), aluminum copper (AlCu), gold (Au), the like, or a combination thereof. In some embodiments, a bonding material layer is deposited over the substrate 462 using a PVD process, a plating process, a CVD process, other applicable processes, or a combination thereof. Afterwards, the bonding material layer is patterned to form the bonding elements 464, as shown in FIG. 4K.

As shown in FIG. 4L, recesses 466a and 466b are formed in the substrate 462, in accordance with some embodiments. The substrate 462 is partially removed from the surface 463a to form the recesses 466a and 466b. For example, a photolithography process and an etching process are performed to partially remove the substrate 462.

As shown in FIG. 4M, an outgassing layer 468 is formed over a bottom of the recess 466a, in accordance with some embodiments. In some embodiments, the outgassing layer 468 is in direct contact with the substrate 462. The outgassing layer 468 may release some gas slowly in a vacuumized space. The outgassing layer 468 may release gas which was previously trapped by the outgassing layer 468 or generated by the outgassing layer 468. In some embodiments, the outgassing layer 468 includes a dielectric material. For example, the outgassing layer 468 is made of silicon oxide which is capable of releasing gas. In some other embodiments, the outgassing layer 468 is made of silicon oxynitride, other suitable materials, or a combination thereof. In some embodiments, the outgassing layer 468 is deposited at a temperature no more than about 500 degrees C. For example, the outgassing layer 468 is deposited using a plasma enhanced chemical vapor deposition (PECVD) process. The deposition temperature may be in a range from about 400 degrees C. to about 500 degrees C. In some other embodiments, the outgassing layer 468 is deposited using a spin-on process or other applicable processes. In some embodiments, an outgassing material layer is deposited and patterned to form the outgassing layer 468. In some embodiments, there is substantially no outgassing material layer left in the recess 466b.

As shown in FIG. 4N, the cap substrate 460 is bonded with the MEMS substrate 400 to form closed chambers 450a and 450b, in accordance with some embodiments. The closed chamber 450a includes the cavity 420a and the recess 466a. The closed chamber 450b includes the cavity 420b and the recess 466b. In some embodiments, the cap substrate 460 is bonded with the MEMS substrate 400 through the bonding elements 416 and 464. In some embodiments, the cap substrate 460 and the MEMS substrate 400 are bonded together by using a eutectic bonding process, a plasma activated bonding process, a thermocompression bonding process, a diffusion bonding process, an anodic bonding process, other applicable processes, or a combination thereof. In some embodiments, the bonding element 416 is made of a metal material, such as aluminum copper, and the bonding element 464 is made of a semiconductor material, such as germanium. In some other embodiments, both of the bonding elements 416 and 464 are made of a metal material, such as gold.

In some embodiments, the bonding process for bonding the MEMS substrate 400 and the cap substrate 460 is performed in a process chamber of a bonding tool. The process chamber is vacuumized to a predetermined pressure. As a result, the pressures of the closed chambers 450a and 450b are substantially the same as the predetermined pressure of the process chamber. In some embodiments, the pressure of the closed chamber 450b is in a range from about 0.01 torr to about 10 torrs. As shown in FIG. 4N, each of the closed chambers 450a and 450b are surrounded by a gas-blocking structure including the substrate 462, the bonding elements 416 and 464, the conductive layer 406, and the dielectric layer 408 which has been annealed at a high temperature. Therefore, the pressures of the closed chambers 450a and 450b are substantially not affected by the environment outside of the closed chambers 450a and 450b.

As mentioned above, the outgassing layer 468 in the closed chamber 450a could release some gas. As a result, the pressure of the closed chamber 450a is changed. Therefore, the outgassing layer 468 is also called a pressure-changing layer. In some embodiments, the pressure of the closed chamber 450a is increased due to the outgassing layer 468. In some embodiments, the increased pressure of the closed chamber 450a is in a range from about 50 torrs to about 760 torrs. In some embodiments, the outgassing layer 468 is heated to induce the outgassing. In some embodiments, the outgassing layer 468 releases some gas at a room temperature without being further heated.

In some embodiments, the movable elements 402b in the closed chamber 450a are used for accelerometer applications. In some embodiments, the movable elements 402c in the closed chamber 450b are used for gyro applications and/or resonator applications.

Embodiments of the disclosure have many variations. FIGS. 5A-5F are cross-sectional views of various stages of a process for forming a MEMS device, in accordance with some embodiments. FIGS. 5A-5E are cross-sectional views of various stages of a process for forming a cap substrate of the MEMS device, in accordance with some embodiments.

Figure 5A:
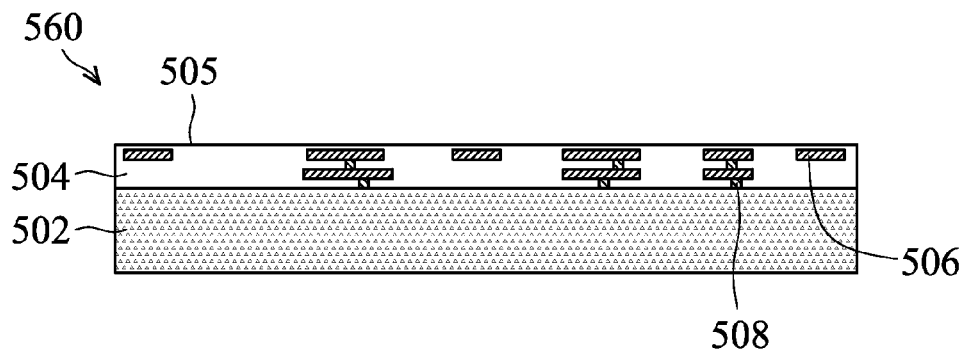
FIGS. 5A-5F are cross-sectional views of various stages of a process for forming a MEMS device, in accordance with some embodiments.

As shown in FIG. 5A, a cap substrate 560 is provided. In some embodiments, the cap substrate 560 includes a complimentary metal-oxide-semiconductor (CMOS) substrate. The cap substrate 560 includes a semiconductor substrate 502 having a number of device elements including CMOS devices (not shown). An interconnect structure is formed over the semiconductor substrate 502. The interconnect structure includes a dielectric layer 504 and interconnect features formed in the dielectric layer 504.

In some embodiments, the interconnect features include horizontal conductive lines 506 and vertical conductive plugs 508 (or conductive vias). The interconnect features are electrically connected to the corresponding device elements of the CMOS substrate. In some embodiments, the interconnect features are made of copper, aluminum, tungsten, nickel, titanium, other suitable materials, or a combination thereof.

In some embodiments, the dielectric layer 504 is made of silicon oxide. The dielectric layer 504 includes multiple dielectric layers. In some embodiments, a dielectric material layer is deposited and planarized to provide the dielectric layer 504 with a substantially planar surface 505. In some embodiments, the dielectric layer 504 is formed using a CVD process, a spin-on process, other applicable processes, or a combination thereof. In some embodiments, the dielectric layer 504 is formed at a temperature lower than about 500 degrees C. Therefore, the conductive lines 506 and the conductive plugs 508 are prevented from being damaged. Since the dielectric layer 504 of the CMOS substrate is not annealed, the dielectric layer 504 also serves as a pressure-changing layer or an outgassing layer. In some embodiments, the dielectric layer 504 releases gas when it is positioned in a vacuumized space.

Figure 5B:
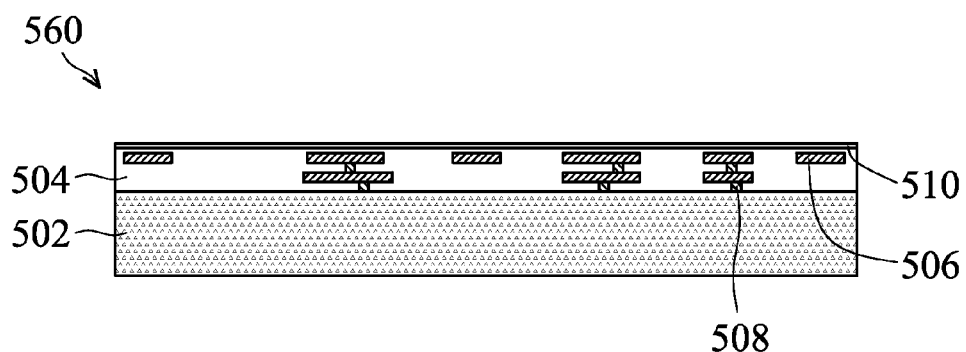

As shown in FIG. 5B, a gas-blocking layer 510 is deposited over the surface 505 of the dielectric layer 504, in accordance with some embodiments. In some embodiments, the gas-blocking layer 510 is made of a dielectric material, a semiconductor material, other suitable materials, or a combination thereof. In some embodiments, the gas-blocking layer 510 is made of silicon nitride. In some embodiments, the gas-blocking layer 510 is a low stress silicon nitride layer. The stress of the gas-blocking layer 510 may be in a range from about −50 MPa to about 50 MPa. In some embodiments, the gas-blocking layer 510 is deposited using a CVD process or other applicable processes.

Figure 5C:
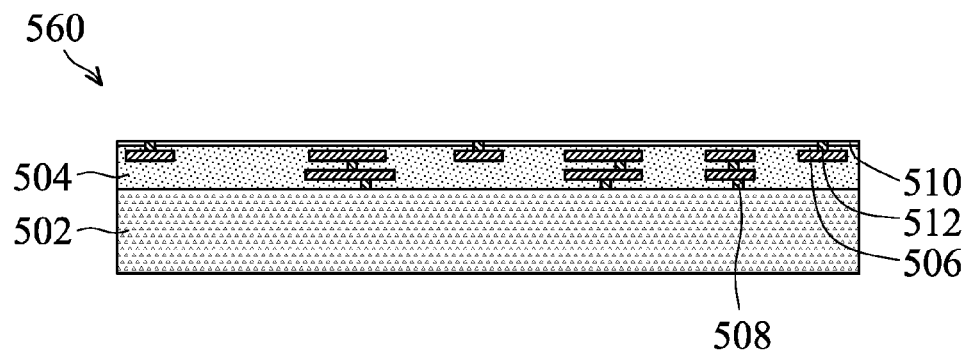

As shown in FIG. 5C, the gas-blocking layer 510 is patterned to form contact holes, in accordance with some embodiments. In some embodiments, conductive plugs 512 are formed in the contact holes to form electrical connections to the device elements of the CMOS substrate through the interconnect features. In some embodiments, the conductive plugs 512 are made of tungsten, copper, or other suitable materials. In some embodiments, the conductive plugs 512 are formed using a PVD process, a plating process, a CVD process, other applicable processes, or a combination thereof. A planarization process may also be performed to finish the formation of the conductive plugs 512.

Figure 5D:
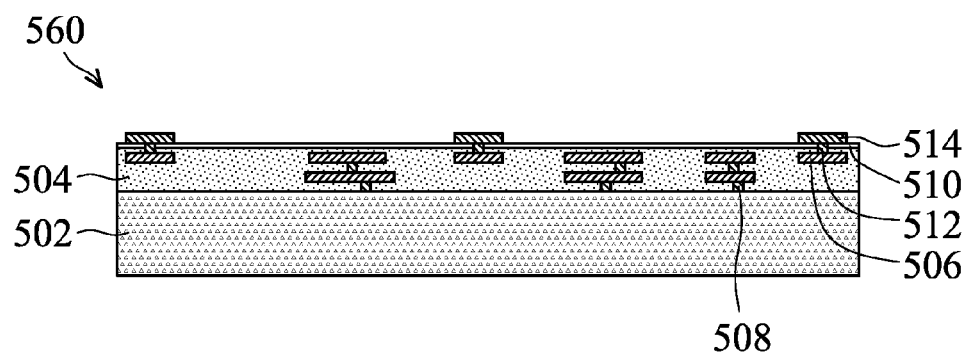

As shown in FIG. 5D, bonding elements 514 are formed over the gas-blocking layer 510, in accordance with some embodiments. In some embodiments, the bonding elements 514 are in direct contact with the corresponding conductive plugs 512, respectively. In some embodiments, an intermediate layer (not shown) is formed between the conductive plug 512 and the bonding element 514. In some embodiments, the bonding elements 514 are made of a semiconductor material, a metal material, other suitable materials, or a combination thereof. For example, the bonding elements 514 are made of germanium or gold.

Figure 5E:
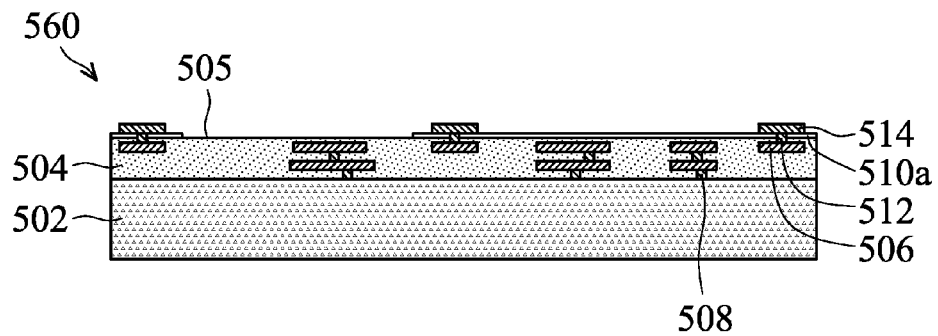

As shown in FIG. 5E, the gas-blocking layer 510 is patterned to form a patterned gas-blocking layer 510a, in accordance with some embodiments. The patterned gas-blocking layer 510a has an opening exposing the surface 505 of the dielectric layer 505, as shown in FIG. 5E. In some embodiments, a photolithography process and an etching process are used to form the patterned gas-blocking layer 510a. In some embodiments, the etchant used for patterning the gas-blocking layer 510 substantially does not damage the blocking elements 514.

Figure 5F:
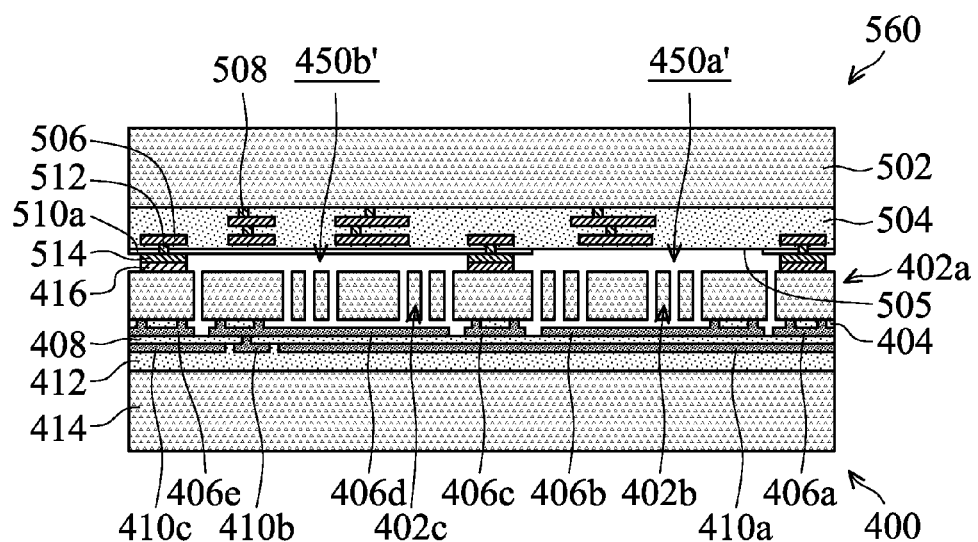

As shown in FIG. 5F, the cap substrate 560 is bonded with a MEMS substrate, such as the MEMS substrate 400 shown in FIG. 4J, to form closed chambers 450a' and 450b', in accordance with some embodiments. In some embodiments, the cap substrate 560 is bonded with the MEMS substrate 400 through the bonding elements 416 and 514. In some embodiments, the cap substrate 560 and the MEMS substrate 400 are bonded together by using a eutectic bonding process, a plasma activated bonding process, a thermocompression bonding process, a diffusion bonding process, an anodic bonding process, other applicable processes, or a combination thereof. In some embodiments, the bonding element 416 is made of a metal material, such as aluminum copper, and the bonding element 514 is made of a semiconductor material, such as germanium. In some other embodiments, both of the bonding elements 416 and 514 are made of a metal material, such as gold.

Similarly, the pressures of the closed chambers 450a' and 450b' are substantially the same as the predetermined pressure of the process chamber of the bonding tool. Afterwards, the dielectric layer 504, which also serves as a pressure-changing layer or an outgassing layer, in the closed chamber 450a' could release some gas. As a result, the pressure of the closed chamber 450a' is changed. In some embodiments, the pressure of the closed chamber 450a' is increased due to the outgassing of the dielectric layer 504. In some embodiments, the dielectric layer 504 is heated to induce the outgassing. In some embodiments, the dielectric layer 504 release some gas without being further heated.

In some embodiments, the patterned gas-blocking layer 510a is between the closed chamber 450b' and the dielectric layer 504. Therefore, outgassing from the dielectric layer 504 is blocked from entering the closed chamber 450b'. The degree of vacuum of the closed chamber 450b' may be substantially maintained.

In some embodiments, the pressure of the closed chamber 450a' is in a range from about 50 torrs to about 760 torrs. In some embodiments, the pressure of the closed chamber 450b' is in a range from about 0.01 torr to about 10 torrs. In some embodiments, the movable elements 402b in the closed chamber 450a' are used for accelerometer applications. In some embodiments, the movable elements 402c in the closed chamber 450b' are used for gyro applications and/or resonator applications.

Embodiments of the disclosure have many variations. For example, the pressure-changing layer or the outgassing layer is not limited to being positioned on the cap substrate. In some embodiments, the pressure-changing layer or the outgassing layer is positioned on the MEMS substrate.

Figure 6:
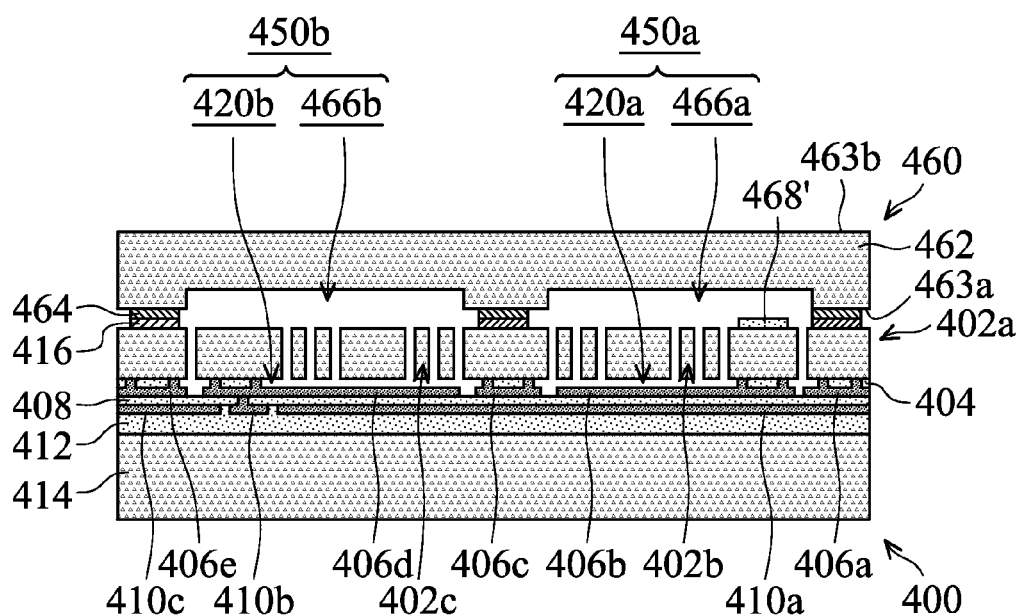
FIG. 6 is a cross-sectional view of a MEMS device, in accordance with some embodiments.

FIG. 6 is a cross-sectional view of a MEMS device, in accordance with some embodiments. As shown in FIG. 6, an outgassing layer 468' (or a pressure-changing layer) is formed over the MEMS substrate 400. In some embodiments, the outgassing layer 468' is in direct contact with the MEMS substrate 400. For example, the outgassing layer 468' is in direct contact with the semiconductor substrate 402. The outgassing layer 468' is used to release gas in the closed chamber 450a. As a result, the pressures of the closed chambers 450a and 450b are different from each other. The movable elements 402b and 402c may therefore provide different functions. In some embodiments, the outgassing layer 468' is formed over the MEMS substrate 400 before the semiconductor substrate 402 is patterned to form the elements 402a.

Embodiments of the disclosure form a MEMS device having two or more closed chambers containing movable elements. An outgassing layer is formed in one of the closed chambers. The outgassing layer could release some gas in the vacuumized and closed chamber such that the pressure of the corresponding closed chamber is increased. The movable elements positioned in the closed chambers with different pressures could therefore provide different functions. The pressure of the closed chamber is changed after the closed chamber is formed. The closed chamber is not open and sealed to achieve a different pressure. Fabrication cost and time are reduced significantly.

In accordance with some embodiments, a micro-electro mechanical system (MEMS) device is provided. The MEMS device includes a cap substrate and a MEMS substrate bonded with the cap substrate. The MEMS substrate includes a first movable element and a second movable element. The MEMS device also includes a first closed chamber between the MEMS substrate and the cap substrate, and the first movable element is in the first closed chamber. The MEMS device further includes an outgassing layer in the first closed chamber. In addition, the MEMS device includes a second closed chamber between the MEMS substrate and the cap substrate, and the second movable element is in the second closed chamber.

In accordance with some embodiments, a micro-electro mechanical system (MEMS) device is provided. The MEMS device includes a cap substrate and a MEMS substrate bonded with the cap substrate. The MEMS substrate includes a first movable element and a second movable element. The MEMS device also includes a first closed chamber between the MEMS substrate and the cap substrate, and the first movable element is in the first closed chamber. The MEMS device further includes a second closed chamber between the MEMS substrate and the cap substrate, and the second movable element is in the second closed chamber. In addition, the MEMS device includes an outgassing layer in the first closed chamber and on the cap substrate.

In accordance with some embodiments, a method for forming a micro-electro mechanical system (MEMS) device is provided. The method includes forming a MEMS substrate, and the MEMS substrate includes a first movable element and a second movable element. The method also includes bonding a cap substrate with the MEMS substrate to form a first closed chamber and a second closed chamber between the cap substrate and the MEMS substrate. The first movable element is in the first closed chamber and the second movable element is in the second closed chamber. The method further includes changing the pressure of the first closed chamber to be a first pressure after the first closed chamber is formed. The first pressure and a second pressure of the second closed chamber are different from each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A micro-electro mechanical system (MEMS) device, comprising:
   a cap substrate;
   a MEMS substrate bonded with the cap substrate, wherein the MEMS substrate comprises at least one first movable element and at least one second movable element;
   a first closed chamber between the MEMS substrate and the cap substrate, wherein the first movable element is in the first closed chamber;
   an outgassing layer in the first closed chamber;
   a second closed chamber between the MEMS substrate and the cap substrate, wherein the second movable element is in the second closed chamber; and
   a blocking layer surrounding the first closed chamber and the second closed chamber, wherein the blocking layer extends towards the cap substrate and the MEMS substrate and surrounds sidewalls of the first closed chamber and the second closed chamber, and the blocking layer is configured to block gas outside of the first and the second closed chambers from entering the first closed chamber and the second closed chamber.

2. The MEMS device as claimed in claim 1, wherein the outgassing layer is in direct contact with the cap substrate.

3. The MEMS device as claimed in claim 1, wherein the outgassing layer comprises a dielectric material.

4. The MEMS device as claimed in claim 3, wherein the outgassing layer comprises a silicon oxide layer capable of releasing gas.

5. The MEMS device as claimed in claim 1, wherein the cap substrate comprises a recess, and the outgassing layer is on a bottom of the recess.

6. The MEMS device as claimed in claim 1, wherein the outgassing layer is in direct contact with the MEMS substrate.

7. The MEMS device as claimed in claim 1, wherein the cap substrate comprises a complimentary metal-oxide-semiconductor (CMOS) substrate with a dielectric layer, and the MEMS device further comprises a gas-blocking layer separating the second closed chamber from the dielectric layer of the CMOS substrate.

8. The MEMS device as claimed in claim 1, further comprising a bonding element between the MEMS substrate and the cap substrate.

9. A micro-electro mechanical system (MEMS) device, comprising:
   a cap substrate;
   a MEMS substrate bonded with the cap substrate, wherein the MEMS substrate comprises at least one first movable element and at least one second movable element;
   a first closed chamber between the MEMS substrate and the cap substrate, wherein the first movable element is in the first closed chamber;
   a second closed chamber between the MEMS substrate and the cap substrate, wherein the second movable element is in the second closed chamber;
   an outgassing layer in the first closed chamber and on the cap substrate; and
   a blocking layer surrounding the first closed chamber and the second closed chamber, wherein the blocking layer extends towards the cap substrate and the MEMS substrate and surrounds sidewalls of the first closed chamber and the second closed chamber, and the blocking layer is configured to block gas outside of the first and the second closed chambers from entering the first closed chamber and the second closed chamber.

10. The MEMS device as claimed in claim 9, wherein the cap substrate comprises a complimentary metal-oxide-semiconductor (CMOS) substrate with a dielectric layer, and the MEMS device further comprises a gas-blocking layer separating the second closed chamber from the dielectric layer of the CMOS substrate.

11. The MEMS device as claimed in claim 9, further comprising a bonding element between the MEMS substrate and the cap substrate.

12. The MEMS device as claimed in claim 1, wherein the outgassing layer is formed over the MEMS substrate.

13. The MEMS device as claimed in claim 7, wherein the dielectric layer of the CMOS substrate forms a portion of an interior wall of the first closed chamber.

14. The MEMS device as claimed in claim 7, wherein the gas-blocking layer is deposited over a surface of the dielectric layer, wherein the surface of the dielectric layer is between the second closed chamber and a top surface of the CMOS substrate.

15. The MEMS device as claimed in claim 10, wherein the dielectric layer of the CMOS substrate forms a portion of an interior wall of the first closed chamber.

16. The MEMS device as claimed in claim 10, wherein the gas-blocking layer is deposited over a surface of the dielectric layer, wherein the surface of the dielectric layer is between the second closed chamber and a top surface of the CMOS substrate.

17. The MEMS device as claimed in claim 7, further comprising at least one conductive plug passing through the gas-blocking layer and being electrically connected to at least one device element of the CMOS substrate.

18. The MEMS device as claimed in claim 17, further comprising a conductive line located within the dielectric layer of the cap substrate, wherein the conductive plug is in contact with the conductive line, and is electrically connected to the at least one device element of the CMOS substrate via the conductive line.

19. The MEMS device as claimed in claim 10, wherein at least one conductive plug passes through the gas-blocking layer and is electrically connected to at least one device element of the CMOS substrate.

20. The MEMS device as claimed in claim 19, further comprising a conductive line located within the dielectric layer of the cap substrate, wherein the conductive plug is in contact with the conductive line, and is electrically connected to the at least one device element of the CMOS substrate via the conductive line.

* * * * *